United States Patent [19]
Porter et al.

[11] Patent Number: 5,122,735
[45] Date of Patent: Jun. 16, 1992

[54] DIGITAL POWER METERING

[75] Inventors: Lawrence R. Porter; Scott H. Hammond, both of Tyler, Tex.

[73] Assignee: TransData, Inc., Richardson, Tex.

[21] Appl. No.: 538,273

[22] Filed: Jun. 14, 1990

[51] Int. Cl.$^5$ .................... G01R 21/00; G01R 21/06
[52] U.S. Cl. .................... 324/142; 324/103 R; 364/483
[58] Field of Search ............ 324/103 R, 142, 141; 364/483, 492, 481

[56] References Cited

U.S. PATENT DOCUMENTS

| | | | |
|---|---|---|---|
| 4,077,061 | 2/1978 | Johnston et al. | 364/483 |
| 4,525,789 | 6/1985 | Kemper et al. | 330/278 |
| 4,595,988 | 6/1986 | Chiffert et al. | 324/142 |
| 4,615,009 | 9/1986 | Battocletti et al. | 324/142 |
| 4,672,555 | 6/1987 | Hart et al. | 324/142 |
| 4,752,217 | 6/1988 | Germer et al. | 324/103 R |
| 4,794,369 | 12/1988 | Haferd | 324/142 |
| 4,795,974 | 1/1989 | Landman et al. | 324/103 R |
| 4,884,021 | 11/1989 | Hammond et al. | 324/142 |
| 4,907,165 | 3/1990 | Toda | 324/142 |
| 4,931,725 | 6/1990 | Hutt et al. | 324/142 |

Primary Examiner—Kenneth A. Wieder
Assistant Examiner—William J. Burns
Attorney, Agent, or Firm—Mueller and Smith

[57] ABSTRACT

A digital power meter achieves enhanced accuracies through the utilization of a sequence of meter stage improvements. Such improvements include the utilization of a digital phase shift based cycle phase realignment following the scaling function of the meter. The cycle phase corrected signals are digitized utilizing a sampling procedure wherein two samples of both current and voltage are taken within a precisely defined sampling interval. These samples are improved by the application thereto of a truncation correction and are averaged prior to being combined to provide quantity signals such as watt, VAR, volt, amperes, and the like. By developing subinterval transfer of components of these quantities to an overflow register, errors otherwise occurring at this stage of metering are substantially eliminated.

27 Claims, 16 Drawing Sheets

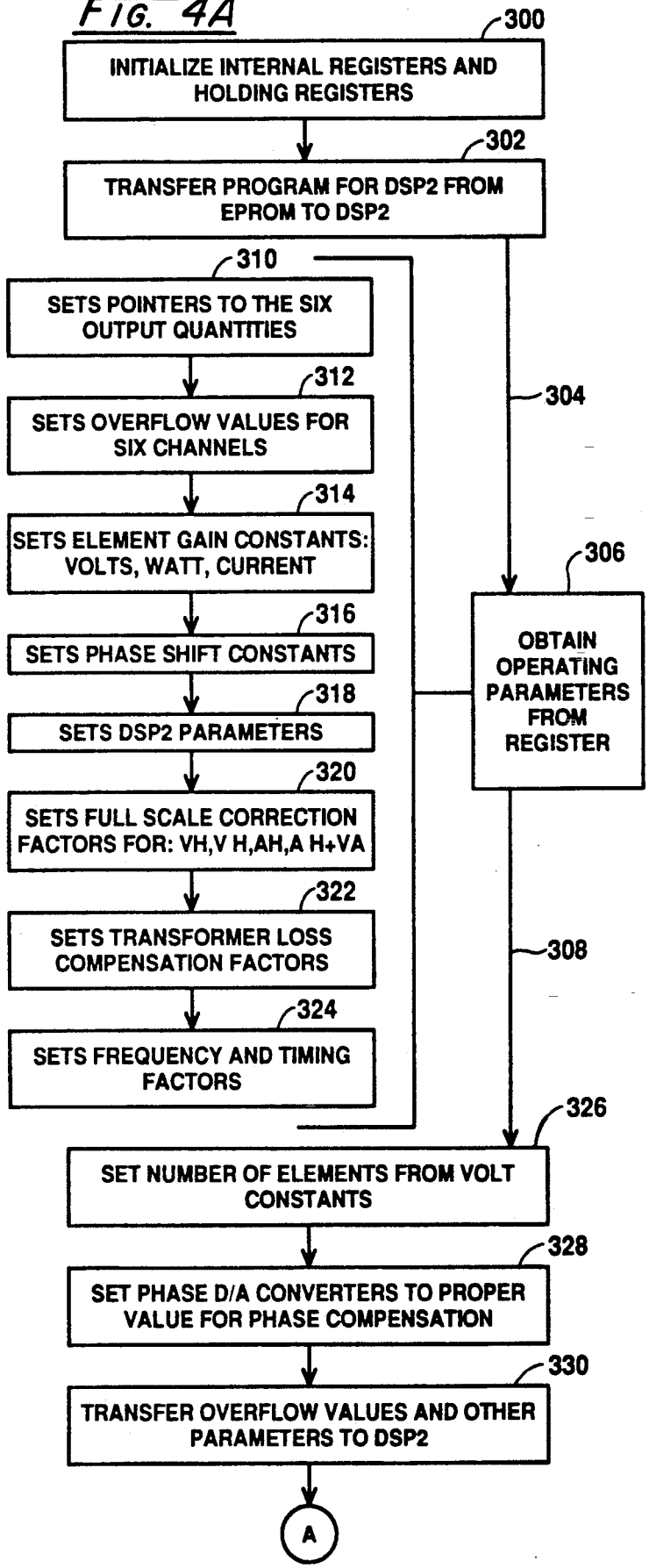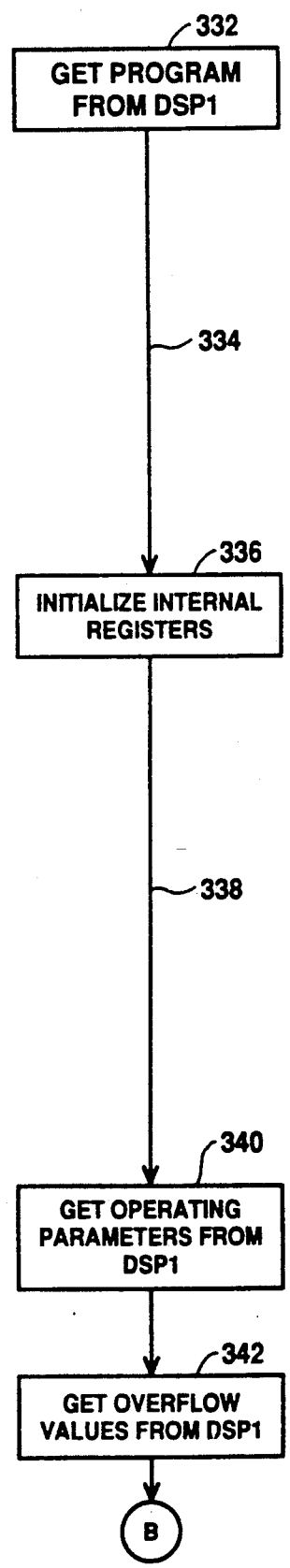

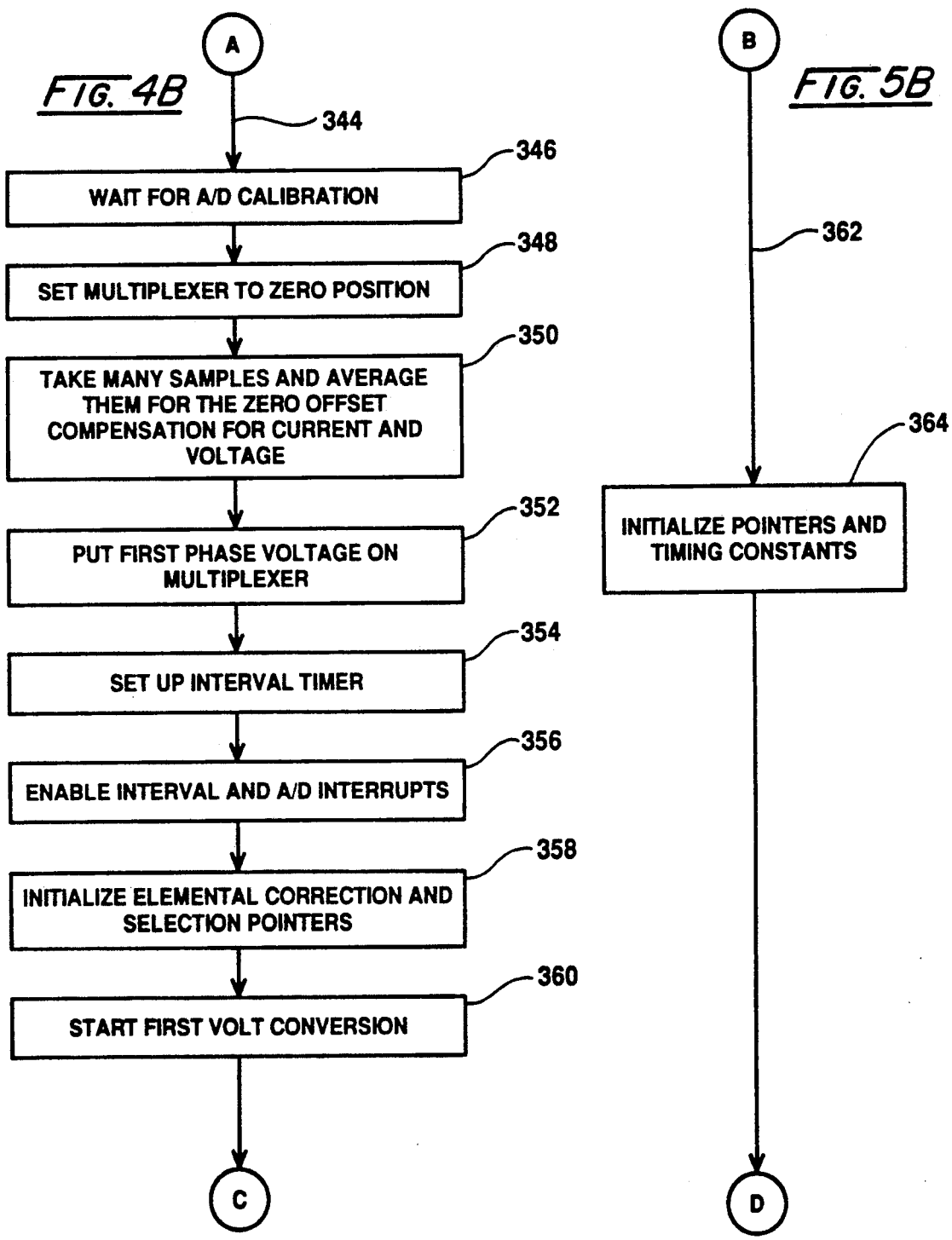

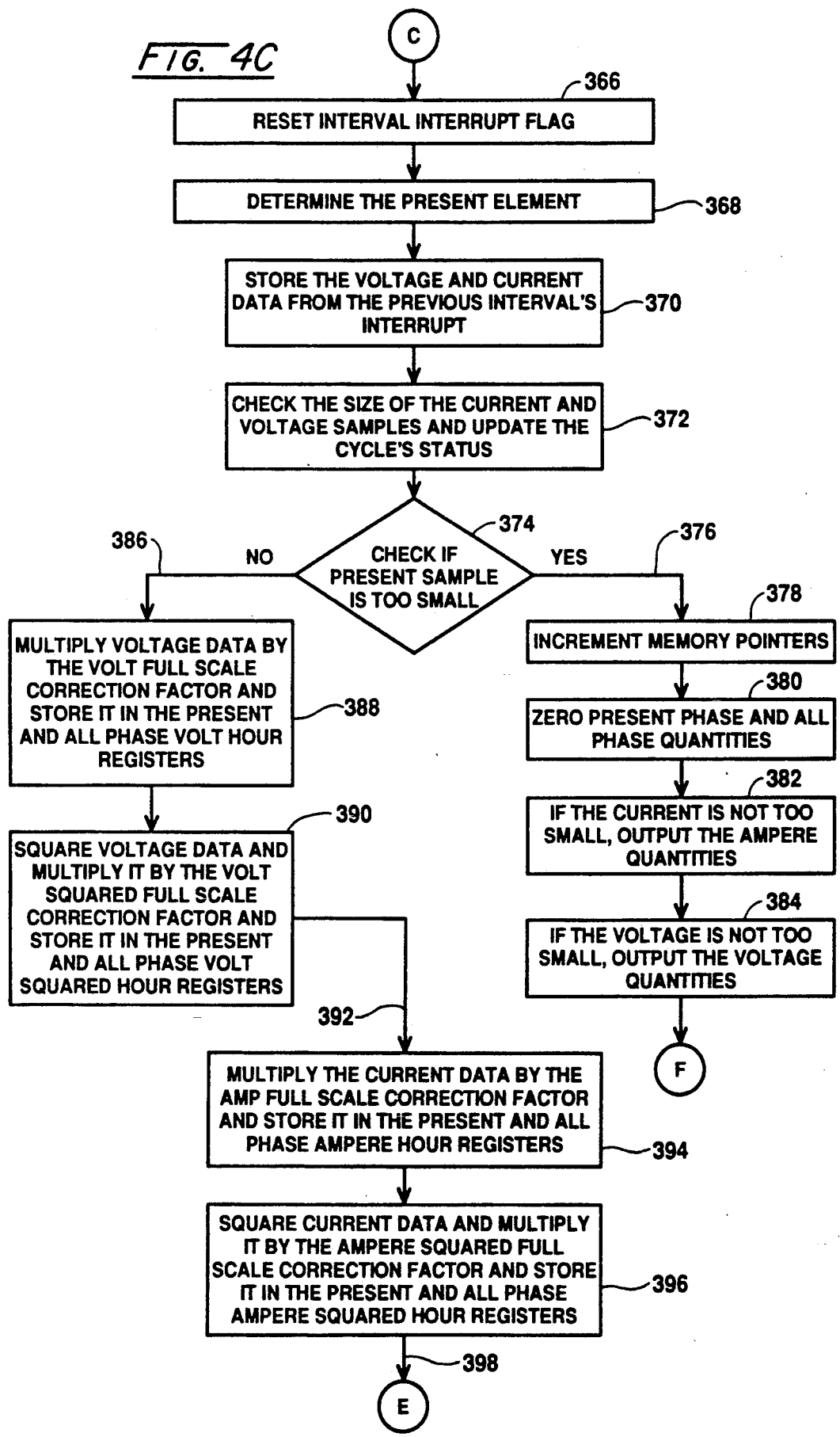

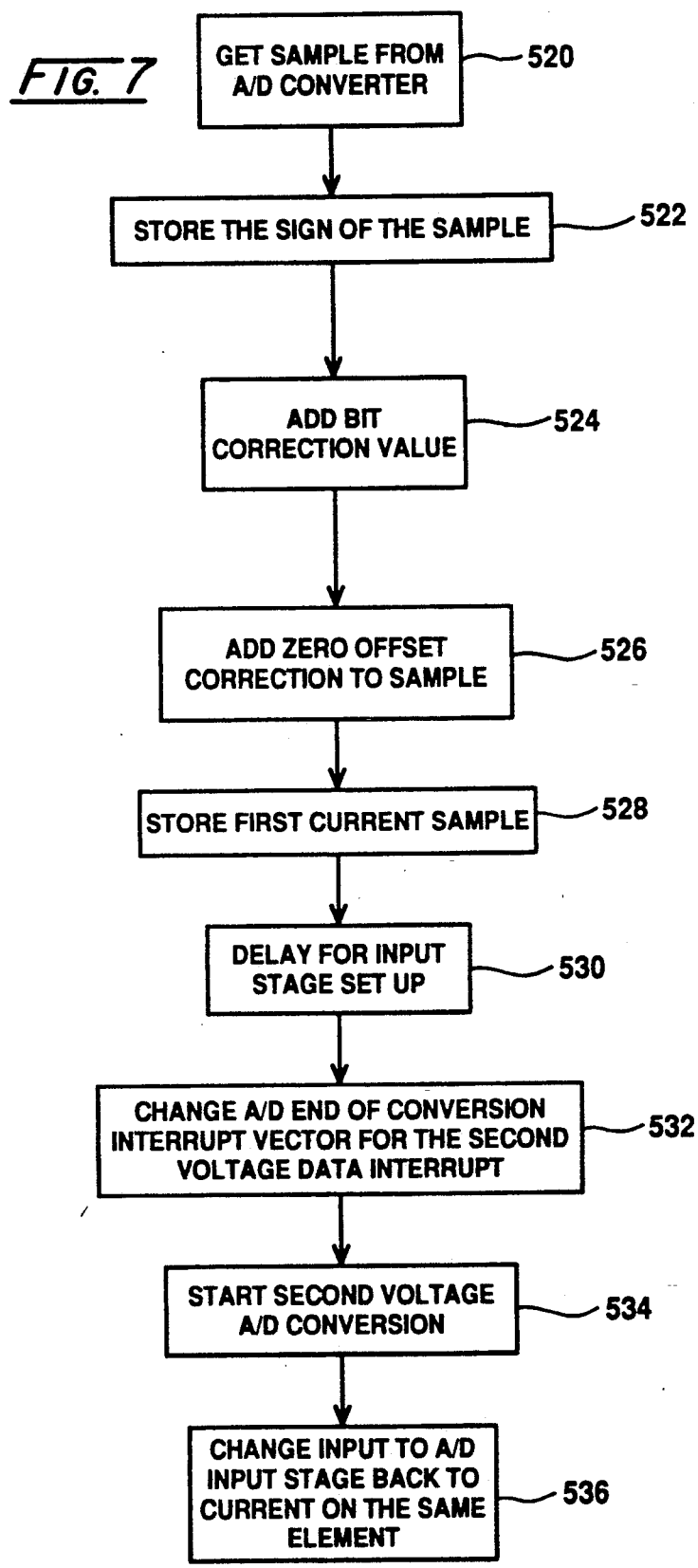

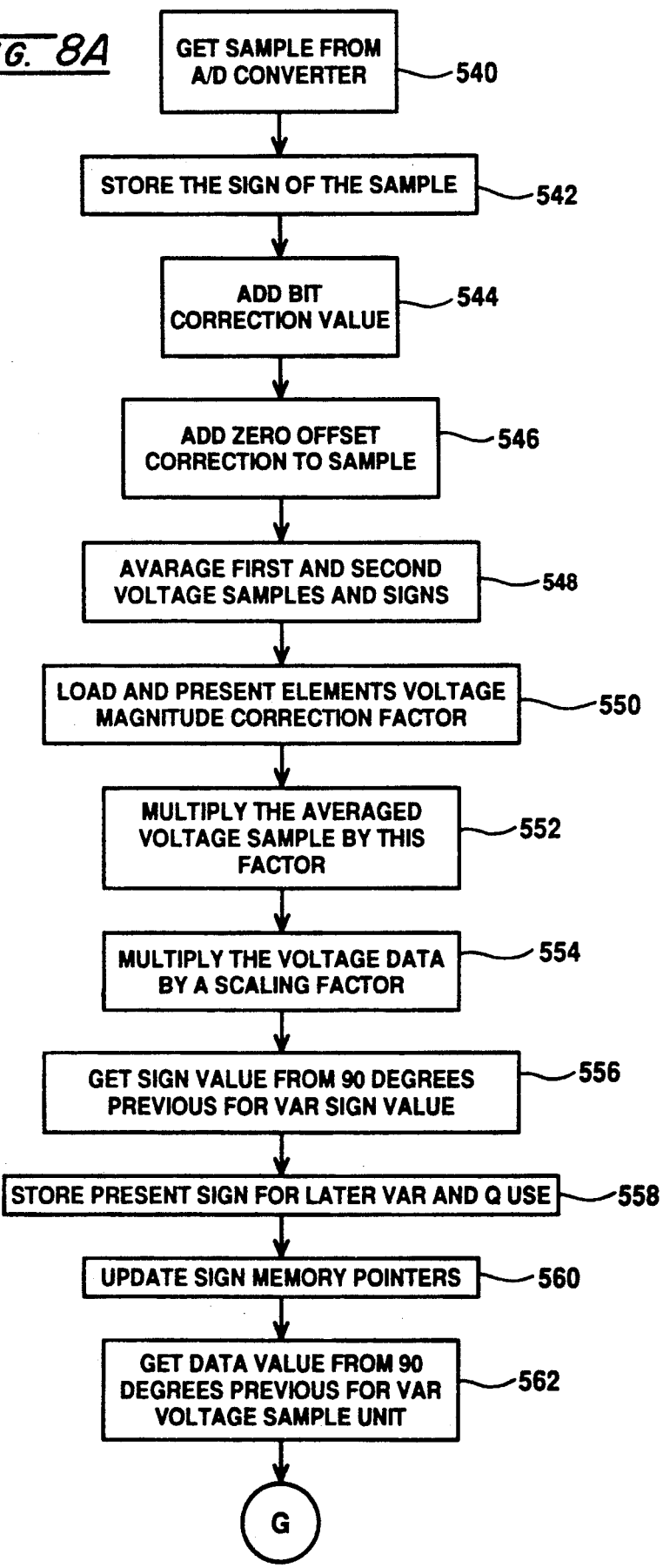

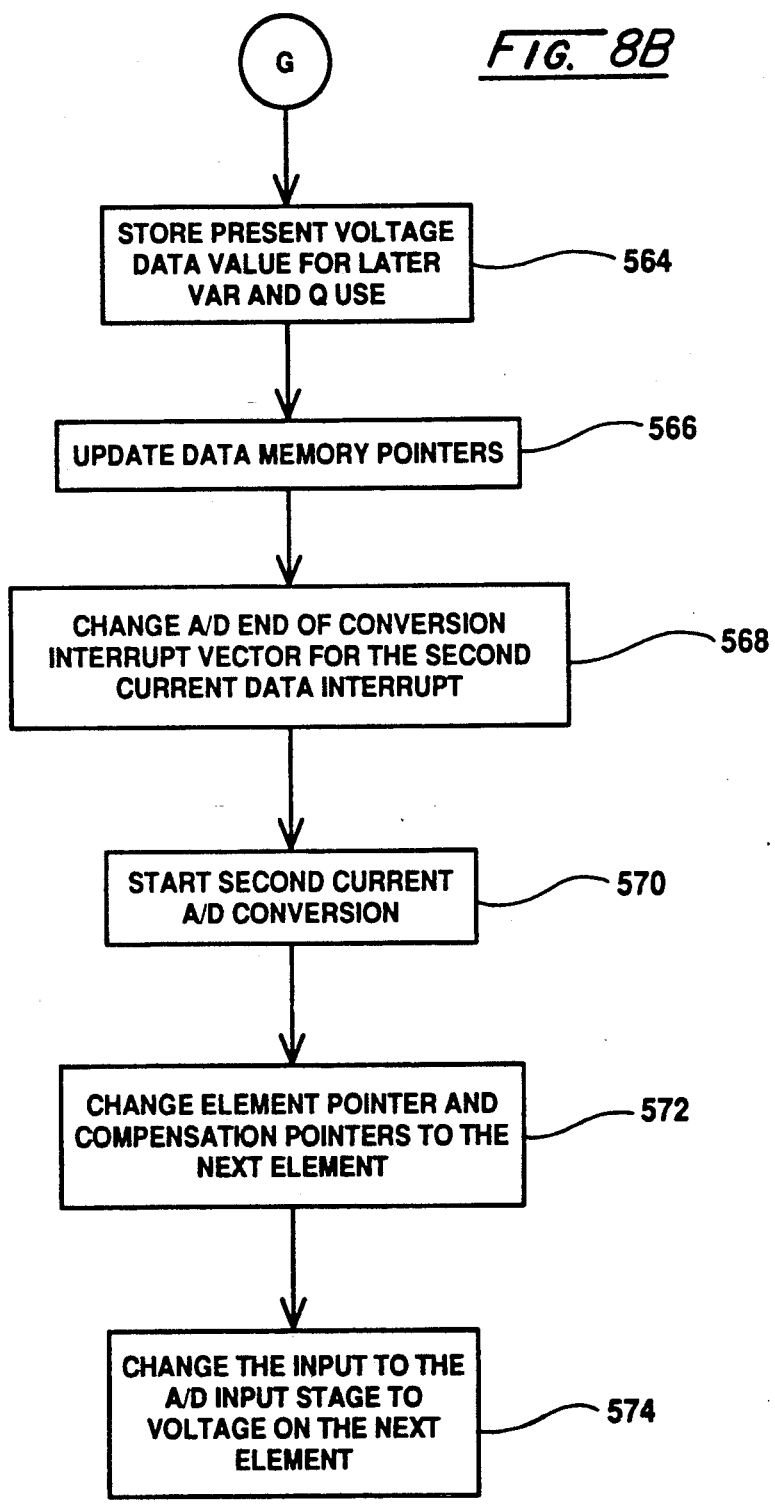

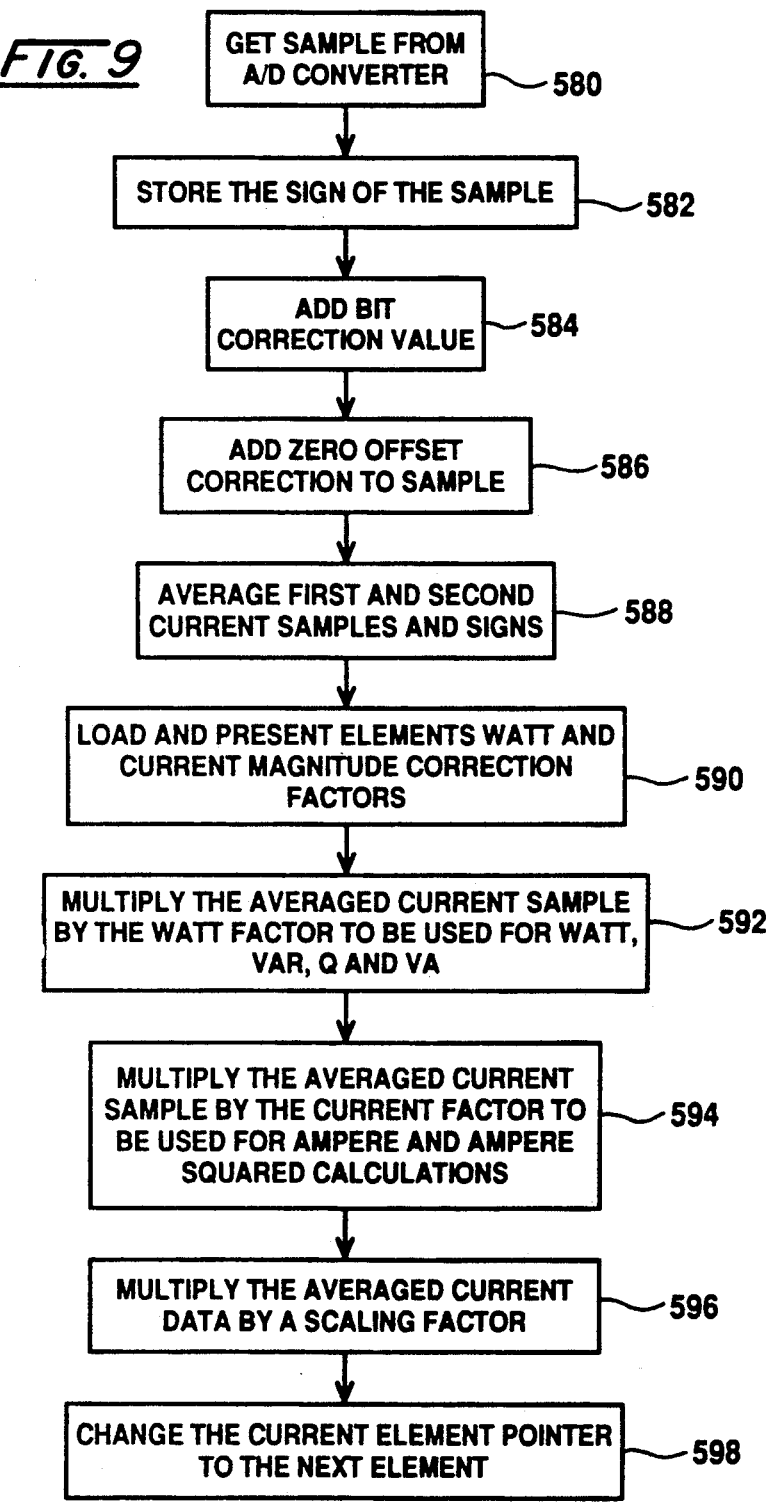

DIGITAL POWER METERING

BACKGROUND

Electrical utilities and principal power consuming industries have employed a variety of metering approaches to provide quantitative and qualitative evaluation of electrical power. The outputs provided by such metering systems vary to suit the particular needs of the user, selection of readouts generally being made from such parameter as volthours, volt$^2$hours, watthours, Qhours, varhours, VAhours, amperehours, and ampere$^2$hours. Certain of these quantities, for example, watt, var, Q, and VA may, for example, be designated as in or out depending upon the direction of current flow, the term "out" representing delivery to the user and the term "in" representing return of power to the generating entity.

Typically, a metering system monitors power supplied to isolation and scaling components to derive polyphase input representations of voltage and current. These basic inputs then are selectively treated to derive units of power and the like as above listed. The most extensively employed technique of power monitoring has been the measurement of watthours through the use of an electromechanical induction meter. However, such devices are limited and, thus, there have developed electronic analog techniques for carrying out multiplication and phase adjustment to achieve higher accuracies and a multitude of readouts.

Early analog approaches taken to provide power parameter outputs initially involve the use of thermally responsive coil elements and the like, the temperatures of which could be converted to outputs corresponding with power values. A lack of convenience and accuracy with such techniques led to interest in the utilization of Hall effect devices as multipliers wherein voltage-proportional generated magnetic fields and current were associated to provide a voltage output proportional to the product of current and voltage. Other devices have been developed which utilize an electronic arrangement serving to capitalize on the exponential transfer characteristic of solid-state devices to carry out multiplication. In general, these early analog multiplication techniques were somewhat unsatisfactory in exhibiting accuracies lower than desired as well as instability.

Another analog multiplier technique currently popular in the industry utilizes the system concept of time division multiplication. For example, the multiplier produces a pulse waveform whose amplitude is proportional to one variable, whose length relative to period is a function of another variable, and whose average value is proportional to the product of the two values. A variety of improvements in such time division multiplier circuits have been developed with respect to controlling phase and phase derived inaccuracies. Such improvements, for example, are described in U.S. Pat. No. 4,356,446, issued Oct. 16, 1982; and U.S. Pat. No. 4,408,283, issued Oct. 4, 1983; both assigned to the assignee of this invention.

Analog approaches to electrical parameter monitoring and multiplication techniques physically are beset with problems in achieving desired output accuracy. Accurate analog multiplier techniques physically are beset with problems in achieving desired output accuracy. Accurate analog multipliers are somewhat expensive and generally exhibit undesirable drift and component variations from device to device. Accordingly, a considerable amount of technique effort is required in their production and maintenance to provide for adjustment for these various inaccuracies. As a consequence of these deficiencies, other approaches have been contemplated by investigators. For example, should the line inputs by purely sinusoidal, then straightforward peak detection techniques would be available. However, line inputs experienced worldwide, while basically resembling sinusoids, exhibit substantial variations representing high and low frequency noise, high energy transients, and a multitude of variations. These variations generally are caused by any of a number of external phenomena, for example, rapidly changing loads developed from solid-state controllers such as silicon controlled rectifier driven devices. In effect, portions of the waveform may be essentially missing due to a high speed switching of loads. Additionally, metering systems may encounter a "creep" phenomenon at their inputs which essentially represents a low level signal amounting to noise.

Purely digital approaches to measuring electric power have been contemplated as ideal. With such an arrangement, for example, high rates of sampling may be employed and the instantaneous sample values then may be converted or digitized as binary values. This ideal approach generally has been considered to require very high speed systems which for some period of time were unavailable or of such cost and complexity as to preclude utilization for the instant purpose. As a compromise to the earlier unavailability of high speed sampling components, relatively slow sampling techniques, i.e. on the order of each 45° of a cycle, have been proposed. To achieve some accuracy, the approaches then must employ an averaging of the sample values and thus, the advantage of high sample rate, instantaneous evaluation of waveform, and the like are not achieved, nor can the systems distinguish discrete vagaries in distorted sinusoids. A typical randomizing approach to digital metering is described, for example, in U.S. Pat. No. 4,077,061, issued Feb. 28, 1978.

A further design aspect which has impeded development of practical digital multiplication circuits resides in the somewhat limited range output of analog-to-digital conversion devices. Those available at practical cost, for example, provide 12 to 16 bit outputs which generally will be found to be inadequate to achieve the scale of accuracy desired by industry without some form of accommodation. In this regard, the conversion devices exhibit a form of truncated performance wherein the digital output thereof is predicated upon a given voltage threshold which may, in reality, fall between two successive digital values, a condition which the devices cannot accommodate.

One approach to achieving a high degree of accuracy using conventional analog-to-digital converters is described, for example, in U.S. Pat. No. 4,884,021, issued Nov. 28, 1989, and assigned in common herewith. The metering system described therein describes a technique for developing high conversion accuracy through a dual sampling technique wherein each sample of current and voltage is first submitted to a conversion to binary form for the purpose of developing a scaling evaluation and a scaling factor. The scaling evaluation is used to selectively adjust the gain of an amplification stage to which the electrical parameter for the sampled quantity is submitted prior to a second conversion. This second conversion then provides a data readout which is multiplied at high speed by the scaling factor to provide an expanded digital data value corresponding with the electrical parameters of voltage and current. The expanded values may, for example, have as high as 21 significant bits in conjunction with a sign bit. These expanded data then are selectively multiplied to develop digital representations for twelve power parameters. Through the use of dual conversion stages in combination with a zero cross-over monitoring of the input sinusoids, otherwise evasive electrical quantities such as volt amperes are readily developed through the metering approach by, in effect, carrying out an alignment of current and voltage sinusoids.

The accuracy of any digital metering approach not only is necessarily concerned with achieving adequate sampling and sufficiently accurate digital conversion, but also with the quality of each succeeding stage or function of the metering device. In this regard, errors may be introduced from a variety of aspects of meter design, for example in phase related components, multiplexing components, timing and final output or register stages. To achieve desired high accuracies, the performance of each such sample or data manipulation stage must be optimized for the generation of low error for outputs ranging from lower values to full scale.

SUMMARY

The power metering approach of the present invention is one wherein requisite output accuracies are achieved by a sequence of metering stage improvements which, not only improve stage accuracy, but also realize cost benefits in the production of the overall meter structure. Phase valuation is carried out without crossover detection approaches or the like and, through accurate sample interval timing, timing delays may be employed to develop power parameters such as Q and VAR. More reliable cycle evaluation is achieved by a sampling sequence for successive sampling intervals which looks to sequentially occurring phase elements. Digital conversion is achieved with a singular converter component which is combined with a bit correction feature and improved accuracies are realized at overflow register stages though a sub-interval based incrementation of data-to-register transfer.

As another feature, the invention provides apparatus for monitoring an electrical power supply having first and second electrical parameters exhibiting given relative cycle phase relationship which includes a scaling arrangement connectable with the supply for deriving first and second electrical parameter signals for corresponding cycles of the supply having a post scaling relative cycle phase relationship. A cycle phase shift network is provided including a phase delay network coupled to receive a select electrical parameter signal for effecting a phase delay thereof in correspondence with the select impedance of a variable impedance component provided as a digital-to-analog converter controllable in response to a digital input for aligning the post scaling relative cycle phase relationship to a correspondence with the given relative cycle phase relationship to provide first and second cycle phase corrected electrical parameter signals. A sampling network is actuable for sampling the amplitudes of the first and second phase corrected electrical parameter signals and deriving corresponding first and second digital sample signals. A control arrangement controls the cycle phase shift network by providing the digital input, the control actuates the sampling network within predetermined regular sampling intervals to derive the first and second digital sample signals for effecting select arithmetic treatment of the first and second digital sample signals to derive digital power quantity signals, and the control arrangement selectively accumulated the digital power quantity signals to derive pulse categorized meter output signals.

A further feature of the invention provides apparatus for metering a power supply. The apparatus includes a scaling arrangement connectable with the supply for deriving scaled current and voltage signals. A selector arrangement is actuable for selecting the scaled current voltage signals and a converter is provided which is actuable to sample the amplitudes of the scaled current and voltage signals within predetermined regular sampling intervals for effecting the conversion thereof to corresponding uncorrected current and voltage digital values. A control arrangement serves to actuate the selector arrangement and the converter arrangement and provides a predetermined intra integer bit correction to the uncorrected current and voltage digital values to derive corrected current and voltage digital sample signals for each supply interval. The control means effects select arithmetic treatment of the corrected current and voltage digital sample signals to derive digital power quantity signals and selectively accumulates the digital power quantity signals to derive pulse categorized meter output signals.

Another feature of the invention provides a method for metering an electrical power supply having first and second parameters exhibiting given relative cycle phase relationship, comprising the steps of:

scaling the first and second parameters to derive corresponding first and second electrical parameter signals;

sampling the first and second electrical parameter signals within predetermined regular sampling intervals to provide corresponding first and second digital parameter signals;

treating the first and second digital parameter signals to provide predetermined electrical quantity signals of given values;

accumulating the predetermined electrical quantity signals for a predetermined interval to provide an accumulated value for the electrical quantity signal;

determining a sub-interval value representing a portion of the accumulated value corresponding with a predetermined increment of a sampling interval;

providing an overflow accumulator having a predetermined overflow value;

transferring the subinterval value to the overflow accumulator until the overflow value is reached; and outputting a quantity pulse when the overflow value is reached.

Still another feature of the invention provides apparatus for metering a power supply having current and voltage parameters exhibiting given relative cycle phase relationship. The apparatus includes a sampling network actuable within predetermined regular sampling intervals to provide current and voltage digital signals corresponding with the current and voltage parameters. A control arrangement is provided which includes a first accumulator function and an overflow accumulator function having a predetermined overflow value. The control selectively actuates the sampling network to derive the current and voltage digital signals and treats the current and voltage digital signals to provide predetermined electrical quantity signals of given values. The control arrangement accumulates the predetermined electrically quantity signals at the first accumulator function for a predetermined interval to provide an accumulated value for the electrical quantity signals and derives a subinterval value representing a portion of the accumulated value corresponding with a predetermined increment of a sampling interval. The control transfers the subinterval values to the overflow accumulator function until the overflow value is reached and outputs a quantity pulse when such overflow value is reached.

Other objects of the invention will, in part, be obvious and will, in part, appear hereinafter.

The invention, accordingly, comprises the apparatus and method possessing the construction, combination of elements, arrangement of parts and steps which are exemplified in the following disclosure.

For a fuller understanding of the nature and objects of the invention, reference should be had to the following detailed description taken in connection with the accompanying drawings.

BRIEF DESCRIPTION OF THE DRAWINGS

FIGS. 4A–4E are a program flow chart describing an initialization procedure and main program loop of the control system of the invention;

FIGS. 5A and 5B are an initialization program for a second digital signal processor employed with the control system of the invention;

FIG. 7 is a flow chart for a first current data interrupt program;

FIGS. 8A and 8B are a flow chart for a second voltage data interrupt program;

FIG. 9 is a flow chart for a second current data interrupt program;

DETAILED DESCRIPTION

Figure 1:
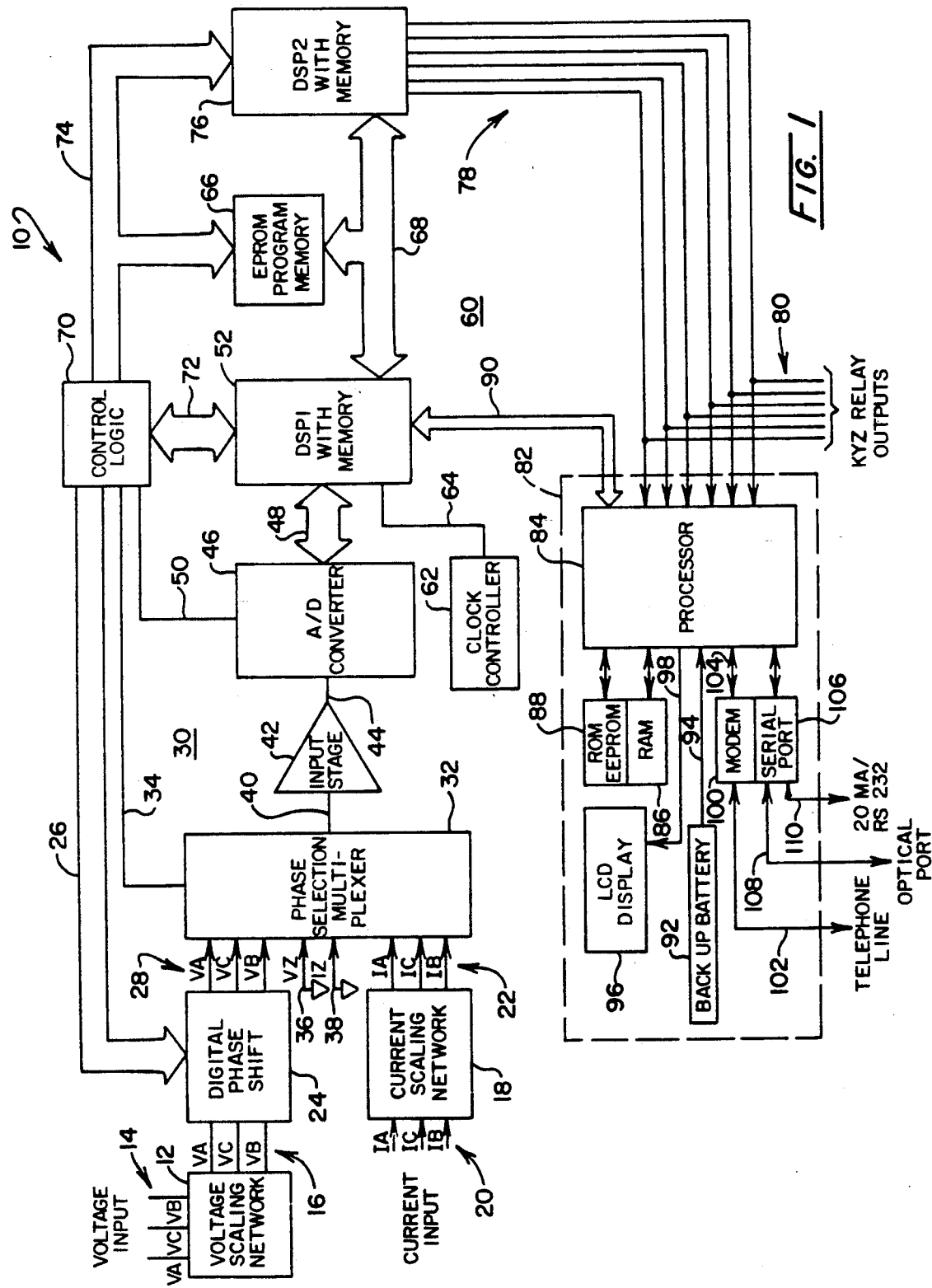
FIG. 1 is a block diagrammatic representation of the metering apparatus of the invention.

Looking to FIG. 1, a representation of the metering approach of the invention is represented generally at 10. Device 10 is coupled typically to a polyphase line input and employs conventional step-down or scaling networks. In this regard, a voltage scaling network is represented at block 12 as being coupled to a three-phase power supply derived voltage input represented at line array 14. It may be noted that the elements (phases) are in the conventionally encountered rotational sequence of A, C and B, labeled, respectively, VA, VC and VB. The appropriate scaled and correspondingly phase or element designated outputs are represented at three-line array 16 carrying the noted element designators. In similar fashion, a current scaling or step-down network is represented at block 18 which is shown being connectable or coupled with current inputs represented at line array 20 and being identified by the element rotational indications IA, IC, and IB. The corresponding scaled and element designated current outputs are represented at three-line array 22 along with corresponding element designation. Because cycle phase shifting errors are introduced in consequence of the necessary transforming function associated with networks 12 and 18, the meter 10 incorporates a digitally controlled phase shift function represented at block 24 which, operating from control asserted from a control bus 26, functions to align the post scaling relative cycle phase relationship of the inputs from arrays 16 and 22 to a corrected relationship corresponding with the initial power supply input, for example as provided from line arrays 14 and 20. Thus, cycle phase corrected voltage signals are developed at the output of network 24 as represented at three-line array 28 which is seen labeled carrying the earlier-noted voltage element designations. Of course, either the voltage or current electrical parameter can be adjusted to carry out this realignment of the cycle phase sinusoids or cycle configurations to their initial relationship. However, practitioners will find it advantageous to carry out the digital cycle phase shift in connection with the parameter of voltage.

The scaled and phase corrected parameters at line arrays 22 and 28 are shown extending to the input of a sampling network represented generally at 30 and including an element selection multiplexer or selector network represented at block 32, the control over which is represented at line 34. Included in this control asserted as represented at line 34 over the multiplexer 32 is a zero offset correction wherein ground or "zero" values for developing zero offset correction factors are generated by coupling the voltage and current inputs thereto to ground as represented respectively at lines 36 and 38 and as labeled "VZ" and IZ". In the course of conventional sampling operation, the elements are scanned with respect to voltage and current in a sequence of accurately timed sampling intervals each representing 2½° of a 360° cycle. The sequence of sampling is such that a voltage sample is taken and digitized for a given element, following which a current sample for that same element is sampled and digitized. Sampling network 30 then returns during that same sampling interval to take another voltage sample with appropriate digitization and another current sample with following digitization. The system then rotates in a next succeeding controlled regular sampling interval to evaluate the next element, for the instant arrangement element C. A dual sample extraction for both voltage and current then is carried out with respect to that element C and appropriate digitization takes place. Next, the next element in conventional rotation or phase B is evaluated with dual samples of both voltage and current in a next succeeding sampling interval representing 2½°. Thus, sampling takes place with respect to all three elements within a combined three intervals representing 7½° of a cycle. For 60 Hz based systems, the time interval represented by that 2.5° is about 115.7 microseconds. By appropriate software control, the multiplexing function 32 may operate with only a single element or two elements, as deemed desirable by the operator. For three element operation, if any change is to occur, for example, zero value signal or the like, in an interval of time greater than 7.5°, the evaluating system of the invention will have "seen" it. This functions to improve the accuracy of the metering evalutation, particularly where poor waveforms or only partial cycle waveforms are encountered. The output of the multiplexing function 32 is represented at line 40 as being directed to an input stage 42. Stage 42 functions to "settle" the voltage signals as are presented from line 40 for the purpose of improving subsequent analog-to-digital conversion. Accordingly, the settled output for each sample is provided at line 44 for a presentation to an analog-to-digital converting function represented at block 46. Operating under controls represented by bus symbol 48 and line 50, the converter 46 digitizes the voltage values asserted thereto at line 44 to carry out a sampling function. This sampling is performed in conjunction with highly accurate sampling intervals of time and, is carried out in a manner providing the noted two voltage readings, two current readings during each sampling interval. Corrections are provided with data developed during initialization procedures wherein zero offset readings are taken. The resultant current and voltage digital sample signals are provided as 16 bits, which includes a sign bit via bus 48 to one of two general purpose digital signal processors, 52 and 76 within the control function of meter 10, represented generally at 60. Digital signal processor (DSP1) 52 carries out the principal control functions of the control system 60 and, in this regard, operates, inter alia, an interrupt fashion in conjunction with a highly accurate interrupt clock controller represented at block 62 and shown communicating with the digital signal processor (DSP1) 52 as represented at line 64. Clock controller 62 provides the timing requisite to performing within the interval samples of 2½. Program memory for the digital signal processor function (DSP1) 52 is represented as an EPROM function at block 66 shown in communication with device 52 via bus symbol 68. Additionally performing in cooperation with the digital signal processor (DSP1) 52 is a control logic network represented at block 70 and shown communicating therewith via bus 72 as well as with memory function 66 via multi-purpose bus 74. Network 70 performs conventional selection and enablement functions with respect to converter 46 as represented at line 50, multiplexer function 32 as represented at line 34 and with respect to the digital phase shift function 24 as represented at bus 26. Operating through bus 74, as well as digital signal processor (DSP1) 52 operating in conjunction with bus 68 logic network 70 additionally performs in conjunction with the second general purpose digital signal processor (DSP2) 76. Processor function 76 also performs in conjunction with a program memory transferred to it by digital signal processor (DSP1) 52 and serves to provide a form of increased time rate of occurrence accuracy of the output pulses generated by the meter 10 which, in turn, represent a given quantity of energy or power measured by the system. These output quantities, now represented in pulse form, are presented on six parallel channel lines represented at line array 78. The pulse carrying outputs at line array 78 are employed in typical fashion to provide KYZ relay outputs as represented at tapping line grouping 80 and also provide the inputs to a microprocessor driven electronic register represented within dashed boundary 82. Register 82 is controlled from a conventional microprocessor represented at block 84, the input ports of which are coupled to receive pulsed signals from line grouping 78. In conventional fashion, the microprocessor 84 operates in conjunction with random access memory (RAM) as represented at block 86, as well as in conjunction with a program contained in read only memory (ROM) and additionally electronically erasable read only memory (EEPROM) as shown at block 88. The electronically erasable read only memory as represented at block 88 functions to carry calibrating information which is submitted to the digital signal processor (DSP1) 52 at such time as the meter 10 is powered up. This communication is carried out through the parallel leads of a DMA bus 90. To maintain the data developed as outputs as array 78, a back-up battery is employed with the register 82 as represented at block 92 and line 94. Microprocessor 84 functions to treat the data received from line grouping 78 and, inter alia, provide a digital display, preferably through a liquid crystal (LCD) display as represented by block 96 and line 98. To permit the device 10 to be programmed remotely, a modem as represented at block 100 is provided which functions to permit carrying out of programming and communication via a telephone link as represented at line 102, the modem interaction with microprocessor 84 being represented at line 104. Similarly, it is desirable to provide for on-site programming, for example, through an infrared (IR) communications or optical link. This is developed through a serial port represented at block 106 and line 108. Also, conventional, serial data communication may be provided through the port 106 as represented at line 110.

Returning to the control arrangement 60, digital signal processor (DSP 1) at block 52 carries out the principal control functions of the device 10 in conjunction with the highly accurate interval timing generated from the clock controller 62. To enhance the accuracy of conversion carried out by converter 46, device 52 accesses memory to retrieve a bit correction value or truncation correction for application to the digitized pairs of voltage and current samples for a given interval of sampling. This procedure is carried out to enhance accuracy, inasmuch as it is the characteristic of analog-to-digital converters to maintain a given digital evaluation until the analog input thereto reaches a next predetermined threshold. Thus, the interval between digitizing thresholds evokes a truncation form of error which, in the absence of, for example, expanded bit performances, represents the subject of error. The selection of the particular correction factor is found to be heuristic in nature, for example, the addition of one unit at the least significant bit position of the converted samples has been found to be appropriate. To further enhance accuracy at this stage of the meter control function 60, the device 52 functions to sum the two voltage digital sampled signals and the two current digital samples and derive the averages thereof for then generating a broad number of electrical quantities. Other corrections include the earlier noted zero offset factor which is developed during initialization by applying the ground signal from lines 36 and 38 for providing digital form corrective components respectively for voltage and current. Such operation occurs in general in next succeeding time sampling intervals to maintain a timed symmetry throughout the data treating process. For example, a simple multiplication of interval sampled voltage and current will provide a watt quantity, while a time delay representing 60° of a given voltage cycle is employed to develop the parameter, Q and, correspondingly, a time delay representing 90° is employed to develop VAR quantities. Such time delay is implemented through the utilization of memory followed by sample interrupt timed recall of the quantities. With such an arrangement, high accuracy is achieved and no cross-over detection schemes and the like are required. In effect, the overall accurate interval timing is employed for a variety of metering stage operations. The volt ampere, VA, derivation is developed as a computation representing the square root of the sum of $VARS^2$ and $WATTS^2$. Because these latter quantities are evolved with a high degree of precision, a corresponding precision is evoked through this procedure for volt ampere determination. In general, the quantities developed will include watthours in and watthours out; varhours lag and varhours lead including in an as well as out values therefor; VAR out, which is the sum of VAR out lag and VAR in lead; VAR in, which is the sum of VAR out lead and VAR in lag; volt ampere hours in and out; Qhours in and out; volthours and $volt^2hours$. Additionally, ampere hours and $ampere^2$ hour quantities are generated at the DSP function 52. Also these quantities are available for any individual of the phases A, C, B and thus a menu representing 64 measured quantities is available to the user for given application needs.

Conventional metering procedures provide for the compilation of computed quantities and electrical parameters in accumulating and overflow registers. As these quantities of varying values are submitted to the latter registers, a build-up occurs in valuation until an overflow or threshold value is reached representing one quantum of measured power or a measured electrical parameter. The registers are then cleared and the procedure commences again. The overflow register then, for predetermined valuations given by the end user for a pulse, is employed to provide such a pulse output as one of, for example, six channels of output as represented at line array 78. Thus, the output of the control 60 is, in effect, a time related valuation. This pulse development, without more, will, in and of itself, impose error in the output of the meter 10, notwithstanding the accuracy of early stages of sampling and conversion. This condition obtains, inasmuch as the overflow register will have a threshold or overflow value which is a fixed and predetermined number. As values are added to the register of varying amounts, that overflow numerical value seldomly will be achieved without applying a number excessive to reach the overflow value. Thus, the metering output, without more, will be defective in the sense that the timed transfer of power quantities will be delayed in consequence of a quantity "overshoot" at the overflow register stage. Through the utilization of digital signal processor (DSP 2) 76, this otherwise imposed time-based inaccuracy is alleviated. Device 76 develops sub-increments of a sampling interval, and derives the increment of the total measured quantity value which represent those sub-increments. In particular, each interval of time representing $2\frac{1}{2}°$ of cycle is divided into seven equal components which are applied seriatim to the overflow register in those successive equal and very small increments of time. Thus, as the overflow value of the accumulating register is approached, the time of transfer of data is improved and the integrity of the meter 10 from its initial stage to this last data treatment carried out by control 60 is maintained. A description of the accumulating and overflow registers is provided in U.S. Pat. No. 4,884,021 (supra) incorporated herein by reference.

Figure 2:
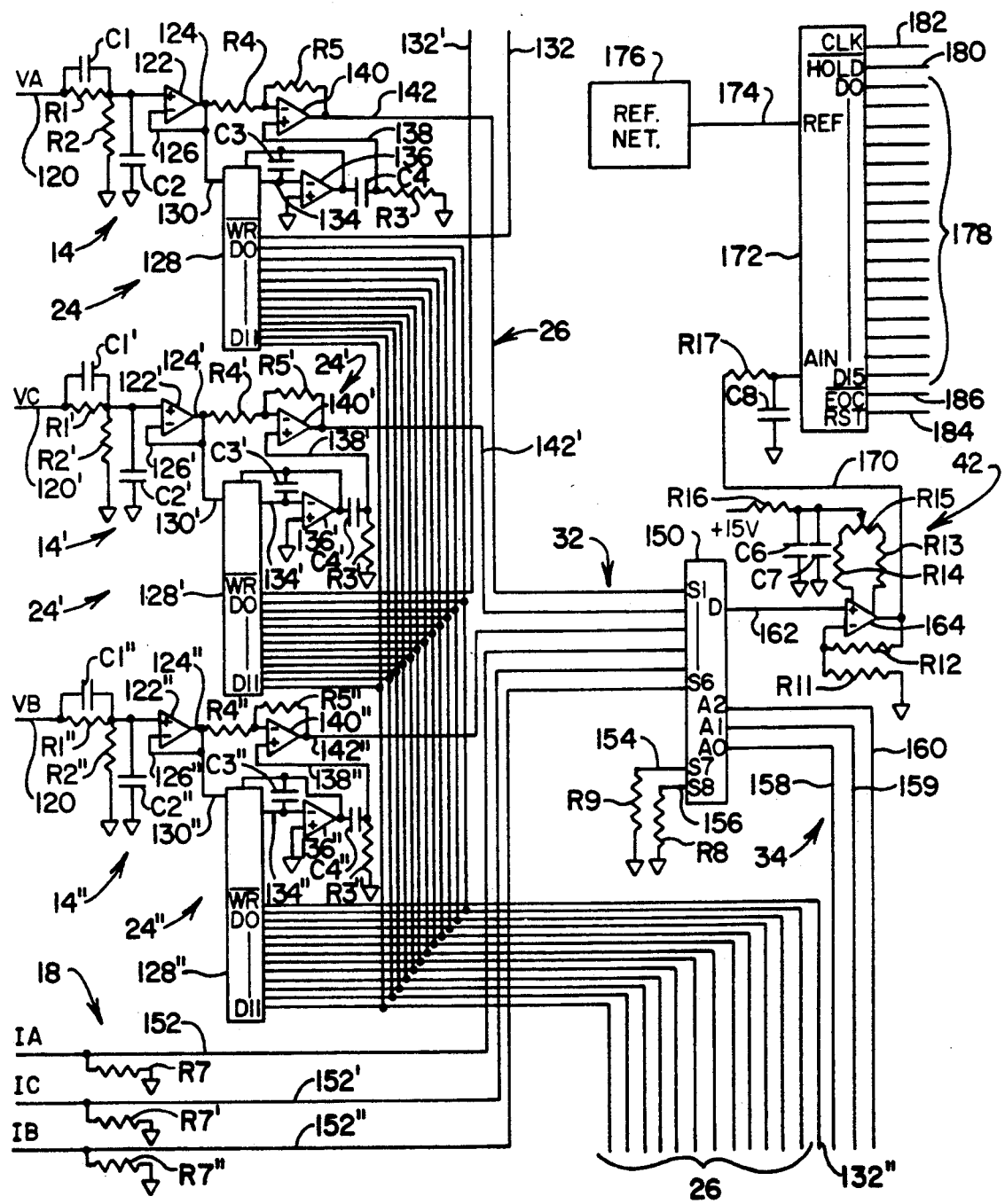
FIG. 2 is an electrical schematic diagram of a cycle phase shift network and sampling network employed with the apparatus of the invention.

Referring to FIG. 2, a more detailed representation of the initial stages of the meter 10 are revealed at an enhanced level of detail. In the figure, the voltage scaling network earlier represented in general at 14 is now depicted in discrete component fashion as three such networks for treating phases A, C, and B. Inasmuch as the scaling and digital phase shift networks are identical in structure, the components thereof are identified with the same alpha-numeric designation but with respective prime and double prime notation. Further, in view of this identity, only the components of phase A are described in detail. Looking to phase A, it may be observed that the signal, VA, is introduced at line 120, whereupon, it is scaled by divider resistors R1 and R2 performing in conjunction with conditioning capacitors C1 and C2 for application to the non-inverting input of an operational amplifier 122. Operational amplifier 122 may be provided, for example, as a type OP-400 marketed by Precision Monolithics, Inc. The output of amplifier 122 at line 124 is coupled to the inverting input thereof via line 126 and is introduced to digital phase shift network 24. Network 24 includes a digital-to-analog converter 128, the reference voltage input to which receives the output of scaling stage 14 at line 130. Converter 128 may be provided, for example, as a type PM-7545 marketed by Precision Monolothics, Inc. and, in effect, develops a select impedance in correspondence with a numerical input thereto provided from a 12-bit bus earlier represented at 26 and identified by the same numeration herein. The write, $\overline{WR}$, input to device 128 is controlled from digital signal processor function (DSP1) 52 as provided via line 132 and the output of the device at line 134 is directed to the inverting input of an operational amplifier 136. In effect, the output at line 134 represents an impedance to this initial amplification stage of the phase shift network 24. Performing in conjunction with conditioning capacitors C3 and C4, as well as resistor R3, the output of amplifier 136 is developed at line 138 which, in turn, is introduced to the non-inverting input of operational amplifier 140. The opposite input to amplifier 140 and line 124 extends through resistor R4 and the output thereof at line 142 carries a digitally-controlled, appropriately phase shifted voltage signal for phase A. A feedback path incorporating resistor R5 also extends between lines 142 and 124. With the arrangement shown, the signal at line 142 will represent an aligning of the post-scaling relative phase relationship to a correspondence with the phase relationship of the input 120 with respect to the current input. Amplifiers 136 and 140 may be provided as the same type described at 122.

Output lines 142, 142' and 142" from respective digital phase shift networks 24, 24' and 24" are directed to the voltage inputs of phase selection multiplexer network 32. For the instant embodiment, the network 32 is provided as an eight channel CMOS analog multiplexer 150, the S1 through S3 inputs to which are derived, respectively, from lines 142, 142', and 142". Correspondingly, the current inputs to device 150 are provided from lines 152, 152', and 152". The latter lines extend from a current scaling network again represented in general at 18 and comprised of resistors R7, R7', and R7". Zero offset or grounding lines earlier described at lines 36 and 38 are introduced, respectively, to the S7 and S8 input terminals of multiplexer 150 through lines 154 and 156 carrying respective resistors R8 and R9 and extending to ground. Control over multiplexer 150 as earlier described in conjunction with line 34 is asserted from the three logic lines 158-160 leading, respectively, to the A0-A2 terminals thereof.

Device 150 may be provided, for example, as a type DG408 CMOS analog multiplexer marketed by Siliconix, Inc. The selected phase output of device 150 is provided at line 162 which is directed to the input stage earlier described at 42 and represented in general by that identifier in the instant figure. Stage 42 is comprised of an operational amplifier 164 performing in conjunction with resistors R11-R17 and filtering capacitors C6-C8. The output of this stage at line 170 extends to the analog input of an analog-to-digital converter 172. A variable resistor R15 is provided in conjunction with amplifier 164 to provide a zero offset correction range adjustment to accommodate for any vagaries in that correction procedure. Amplifier 164 may be provided as a type OP-16 marketed by Precision Monolithics, Inc.

Converter 172, the function of which is described herein earlier in general at 46 is designated by that number in general in the instant figure. The device may provided, for example, as a 16-bit monolithic analog-to-digital converter with a 16.25 microsecond conversion time. The device is marketed, for example, as a type CS5016 by Crystal Semiconductor Corporation.

A reference input to converter 172 is represented at line 174 extending from block 176. This reference function may be provided in conventional fashion, for example employing a precision reference type LT-1021 marketed by Linear Technology, Inc. The digital output of converter 172 is provided at the 16 output leads represented within bracket 178, while the hold terminal thereof is represented at line 180; the clock terminal thereof is represented at line 182; the reset input thereto is represented at line 184; and the $\overline{EOC}$ terminal is represented at line 186.

Figure 3A:
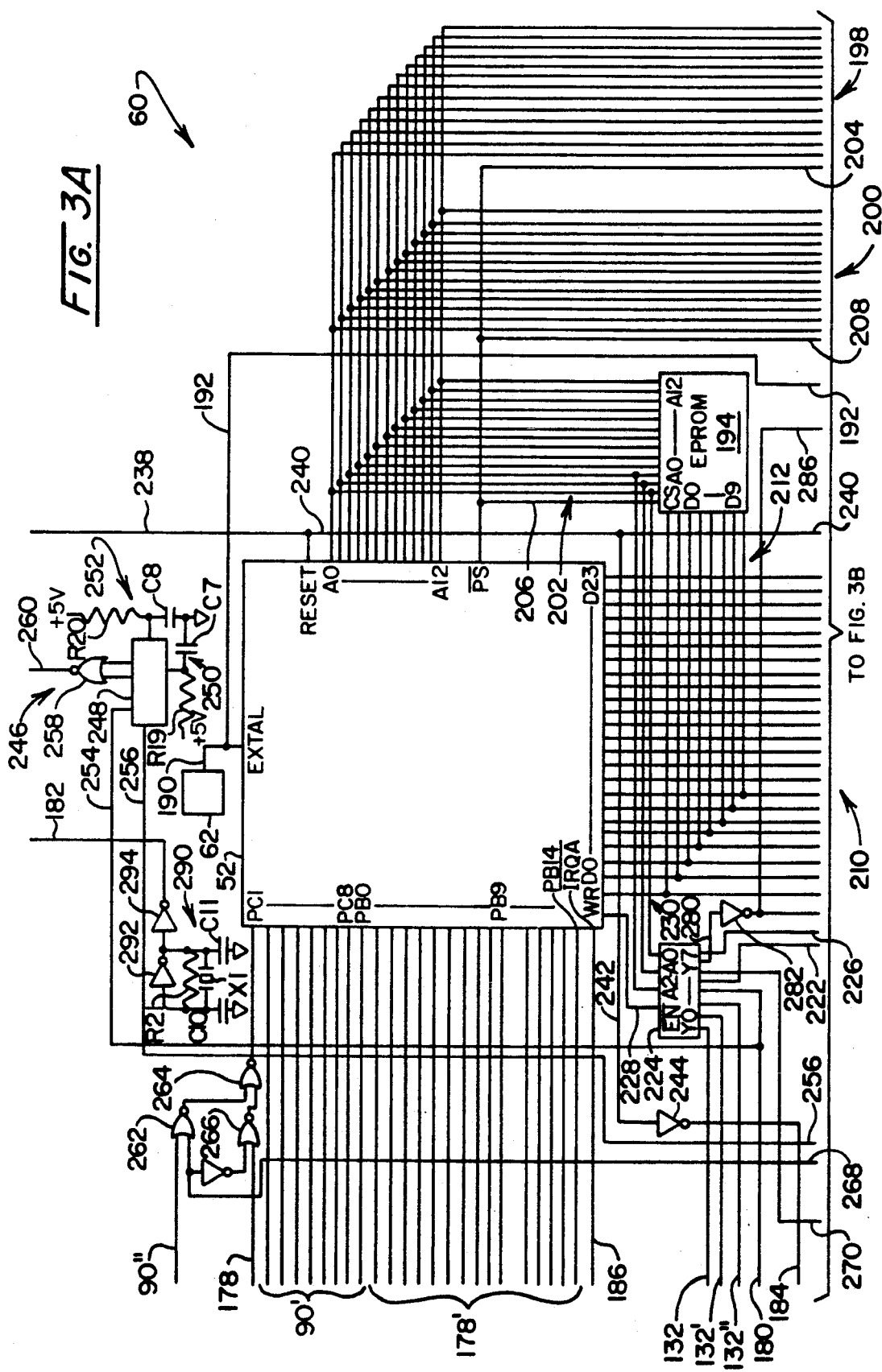
FIGS. 3A and 3B combine as label thereon to provide a schematic circuit diagram of control features of the apparatus of the invention.
Figure 3B:
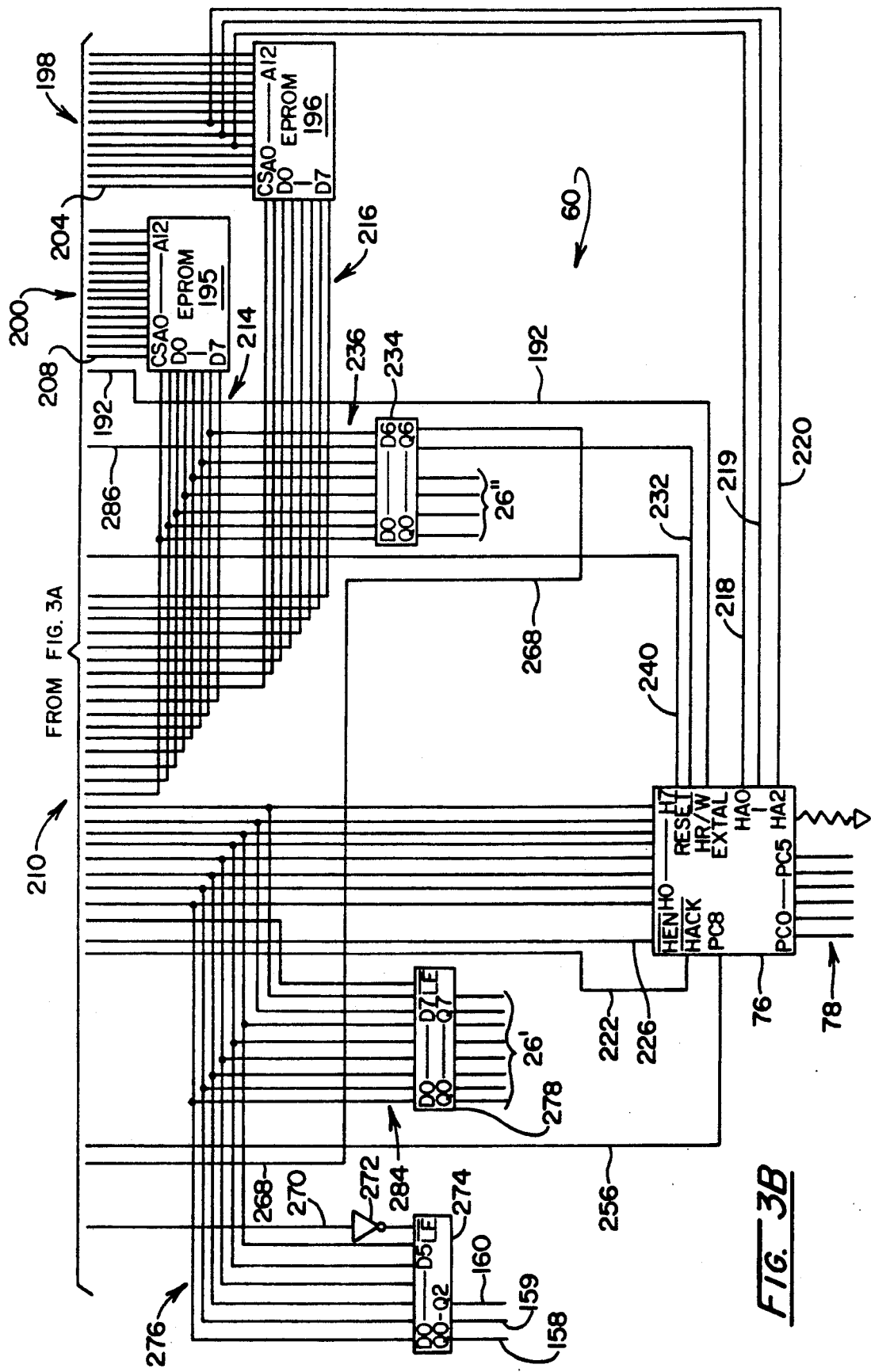

Control system 60 is represented at an enhanced level of detail in connection with FIGS. 3A and 3B which should be considered together in accordance with the labeling thereon. In the figure, the digital signal processor (DSP1) 52 again is identified by that numeration and is provided as a low power, general purpose digital signal processor. In particular, a type DSP 56001 device marketed by Motorola, Inc. may be employed for the instant purpose. Such a device incorporates three execution units operating in parallel, to wit: a data ALU, an address generation unit, and a program controller. The high throughput of such devices make them well suited for the high speed numeric processing involved with meter 10. In the latter regard, the device exhibits a speed of 10.25 million instructions per second (MIPS) and exhibits data paths which are 24 bits wide. Device 52 operates in conjunction with a highly accurate clock controller again represented at 62 in FIG. 3A. Clock function 62 may, for example, be provided as a 401 series crystal oscillator marketed by Anderson Electronics, Inc. The output of device 62 is presented at line 190 to the EXTAL input terminal of device 52 and, additionally, is seen to be asserted along line 192 to the corresponding EXTAL terminal of digital signal processor 76 as seen in FIG. 3B. DSP device 52 performs in conjunction with EPROM program memory as described at block 66 in conjunction with FIG. 1. This memory is represented in FIG. 3A at 194 and in FIG. 3B at 195 and 196. Devices 194-196 may be provided, for example, as 64K, ultra-violet-light erasable, electrically programmable, read only memories marketed as type TMS27C49 by Texas Instruments, Inc. Each of the memories 194-196 are associated with the address ports of digital signal processor 52 through a bus network including bus lead arrays represented generally at 198, 200, and 202. The program memory select terminal of device 52 is seen coupled to memory component 196 via line 204 and to memory devices 194 and 195 via respective lines 206 and 208. The bi-directional data bus ports (D0-D23) of device 52 are coupled with bi-directional data bus 210. Bus 210, in turn, is connected with the D0-D7 data ports of memory component 194 through a connecting bus 212. FIG. 3B reveals a similar arrangement with respect to memory component 195, a connecting bus 214 being shown connecting the data terminals D0-D7 of that memory with bus 210, and, similarly, connecting bus 216 extends from the D0-D7 terminals of memory component 196 to bus 210.

FIG. 3B reveals that digital signal processor (DSP2) 76, which is identical to that at 52, provides a coupling with the six channel data output represented in FIG. 1 at 78 and represented in the figure with the same numeration from its port C outputs PC0-PC5. Additionally, the HA0-HA2 terminals thereof providing an address selection for each host interface register are coupled via respective lines 218-220 to bus 198. The host acknowledge terminal ($\overline{HACK}$) of device 76 is seen coupled via line 222 to one output of a control logic device 224 (FIG. 3A) while the host enable port ($\overline{HEN}$) input thereto, enabling data transfer on the host data bus is coupled to the same logic component 224 via line 226. Control logic device 224 forms one component of the general function represented at block 70 in FIG 1 and may be provided, for example, as a one-of-eight decoder, for example type 74HC138 marketed by Motorola, Inc. The enable terminal ($\overline{EN}$) of device 224 is coupled via line 228 to the write ($\overline{WR}$) terminal of DSP device 52, while the address terminals thereto (A0-A2) are coupled via three line grouping 230 to bus component 206. The Y0-Y2 terminals of device 224 extend, respectively, to lines 132, 132', and 132" representing inputs to the write ($\overline{WR}$) terminals of digital-to-analog converters 128, 128', and 128". In similar fashion, the Y3 terminal of device 224 is directed to the $\overline{HOLD}$ terminal of analog-to-digital converter 172 (FIG. 2). Returning to FIG. 3B, the H0-H7 ports to DSP device 76 are coupled with bus 210 extending to device 52, while the HR/$\overline{W}$ port thereof selecting the direction of data transfer for each host processor access is coupled via line 232 to one output of control logic device 234. As before, device 234 forms a component of the control logic function 70 described in conjunction with FIG. 1, and may be provided as an octal three-stage non-inverting transparent latch, for example type 74HC373 marketed by Motorola, Inc. The D0-D6 inputs to this device are seen coupled by bus component 236 to corresponding bus component 214. Both DSP devices 52 and 76 as well as A/D converter 172 may be reset from the register function 82 described in conjunction with FIG. 1. This input is represented as extending at lines 238 and 240 in FIG. 3A to device 52 at the reset terminal thereof and via line 240 to the corresponding reset terminal of device 76. This same reset signal is transferred via line 242 (FIG. 3A) through inverter 244 to earlier-described line 184 extending to the reset terminal (RST) of converter 172. DSP devices 52 and 76 also are monitored by a watchdog network represented at 246 in FIG. 3A which is comprised of a retriggerable, resettable monostable multi-vibrator 248 performing in conjunction with RC networks 250 and 252 formed, respectively, of resistor-capacitor combinations R19-C7 and R20-C8. Provided, for example, as a type 74HC4538 marketed by Motorola, Inc., the A1 input terminal of device 248 is seen to extend via line 254 to output line 180 of control logic device 224, while the A2 terminal thereof extends via line 256 to the PC8 terminal of DSP device 76. Network 246 provides an output through NOR gate 258 to line 260 which extends, in turn, to the register function 82 (FIG. 1) to develop a request to reset datum in the presence of a malfunction.

FIG. 3A also reveals that the PC1-PC8 terminals of DSP device 52 are directed to register 82 as shown in FIG. 1 at bus 90 as providing direct memory access (DMA) communication. Accordingly, those bus portions are labeled 90′ in FIG. 3A. One additional lead extending to the PC0 port of device 52 is represented at 90″. This input extends to NOR gates 262 and 264 which, being configured in conjunction with gate 266, provide for dual utilization of port PC0. The second input to that gate is a digital output from converter 172 (FIG. 2) among the outputs as bracketed at 178. Control over the selection of the receiving path of this arrangement is from line 268 extending from one output of control logic devices 234 seen in FIG. 3B. The $\overline{IRQA}$ port of DSP device 52 is coupled with line 186 extending, in turn, to the $\overline{EOC}$ terminal of converter 172 for providing an external interrupt signal.

Returning to the control logic function components in FIGS. 3A and 3B, device 224 is seen to provide an enablement via line 270 and inverter 272 to a control logic device 274. Device 274 may be provided, for example, as an octal three-state non-inverting transparent latch of the variety described at device 234. The data inputs to device 274 at bus component 276 extend from bus 210 and provide outputs at earlier-described lines 158-160 which are described in conjunction with FIG. 2 as the selector inputs to multiplexer 150. Logic device 224 also functions to enable a control logic device of the same variety as that at 274 at 278 via line 280 and inverter 282. The data inputs to device 278 are derived from bus component 276 through bus component 284 and the selected outputs thereof provide the digital inputs to digital-to-analog converters 128, 128′, and 128″ shown in FIG. 2 through input lead grouping 26 represented in FIG. 3B at 26′. Enablement from line 280 and inverter 282 also extends via line 286 to earlier-described device 234. The four lead outputs of this device additionally extend to the earlier-noted digital-to-analog converter inputs at bracket 26 and are labeled in FIG. 3B within the bracket 26″.

FIG. 3A also reveals the presence of a crystal controlled oscillator network 290 comprised of crystal X1 performing in conjunction with capacitors C10, C11, resistor R21, and inverters 292 and 294 to provide a clock or oscillating output at line 182 which is directed to the corresponding clock input to analog-to-digital converter 172 as shown in FIG. 2.

Looking to FIGS. 4A and 4B, a flow chart describing the initialization procedures for digital signal processor (DSP1) 52 is revealed in juxtaposition with a corresponding initialization program for the companion digital signal processor (DSP2) shown at block 76 in FIG. 1. Looking to FIG. 4A, the initialization program is seen to commence with the initialization of internal registers and holding registers, whereupon, as represented as block 302, the control program for operating digital signal processor (DSP2) 76 is transferred from memory 66 thereto. The program then proceeds to carry out a sequence of instructions comprising the obtaining of operating parameters from the register 82 as represented at line 304, block 306, and line 308. Among the parameters obtained, for example through DMA connection 90, as represented at block 310, the six output quantities to be delivered via six line output 78 are identified by appropriate pointer settings. It may be recalled that 64 different quantities are available to the operator of the instant device 10. As noted above, these quantities include at least 16 basic electrical parameters for each of three phases A, C, and B. The availability of a metering output for each separate phase in one meter is quite helpful to utility organizations who are called upon to divert a circuit to sub-stations and the like and an evaluation of the loads on each of the phases for such diversion selection purposes is quite helpful. This can be carried out utilizing device 10 without the use of separate metering for each phase.

Block 312 shows that the initialization program sets overflow register values for these six selected output quantities. These overflow values determine the rapidity of the output pulse rate and such values may vary according to the desires of the operator for each of the six channels at output 78. Next, the gain constants representing step-down inaccuracies in the transforming functions are set for each of the current and voltage outputs. In effect, these constants represent a form of scaling factor. Additionally, phase shift constants are set. These constants are values submitted to digital phase shift networks 24 to achieve the alignment of phase following scaling to their original relationship. Certain parameters for the operation of digital signal processor 76 (DSP2) are set. For example, these parameters will adjust for a variation between 60 Hz operation and 50 Hz operation and the like.

The full scale correction factors for voltage, voltage$^2$, current, and current$^2$, are then set as represented at block 320. Next, the transformer loss compensation factors are set as represented at block 322 and frequency and timing factors are recovered from register 82. Next, as represented at block 326, the number of elements or phases which are to be measured is determined from the setting of the volt constants. In this regard, where such constant is set to zero, then the program will not scan that particular parameter. Accordingly, meter 10 can be used as a single element device, a dual element device, or a three element device.

The program then continues as represented at block 328 to submit the numerical data to the digital-to-analog converters 128 of the digital phase shift circuit 24. Similarly, the overflow values and other parameters derived from register 82 are transferred to digital signal processor (DSP2) 76 as represented at block 330. The prgram then continues as preresented at node A.

Looking momentarily to FIG. 5A, it may be observed that the initialization program for digital signal processor (DSP2) 76 commences with the acquisition of the program from corresponding processor (DSP1) 52 as represented at block 332. The program then continues as represented by line 334 and block 336 to initialize internal registers. Then, as represented at line 338 and block 340, operating parameters are obtained from signal processor (DSP1) 52 and as shown at block 342 overflow values and other timing considerations are obtained from processor (DSP1) 52. The program then continues as represented at node B.

Looking to FIG. 4B, node A again continues leading to line 344 and block 346 wherein a dwell occurs awaiting for the calibration of analog-to-digital (A/D) converter 46. Generally, such conversion devices require a certain interval of time, for example 360 ms, for self-calibration. Following this calibration, as represented at block 348, the multiplexer 32 is set to a zero position representing a scan commencement position. The program then continues as represented at block 350 wherein a plurality of zero offset samples are taken and averaged to develop that correction factor for current and voltage. This is described earlier in conjunction with input lines 36 and 38 in FIG. 1. Next, the first phase or element voltage is accessed by the multiplexer 32 as represented at block 352 and the interval timer is set up as represented at block 354. This timer is the highly accurate sample interval timer which is described in the instant embodiment as representing $2\frac{1}{2}°$ of cycle time. Next, as represented at block 356, the interval and analog-to-digital interrupt are enabled. Note that an interrupt form of operation is presented based upon this highly accurate timing evolved from clock 62. It is this overall compliance of the system with highly accurate $2\frac{1}{2}°$ interval timing from which numerous operational advantages accrue. Additionally, upon the completion of any given analog-to-digital conversion by converter 46, an interrupt to the digital signal processor (DSP1) 52 occurs. Thus, the processing component is not called upon to await digitized values. The processor 52 then initializes all pointers and correction values as represented at block 358 such that the system is set to start out and measure the first voltage and, as represented at block 360, the first voltage conversion is commenced. The program then continues as represented at node C in a somewhat looping fashion.

Looking momentarily to FIG. 5B, the processor (DSP2) 76 program is seen to continue from node B as represented at line 362 and block 364 to initialize its pointers and timing constants. The program then continues as represented at node D.

In effect, three program activities occur during the operation of device 10. The main program perform following the initialization described in conjunction with FIGS. 4A and 4B to enter into a main program loop. Simultaneously, following the initialization procedures of FIGS. 5A and 5B, the second digital signal processor (DSP2) 76 carries out an increased time accuracy output routine and interrupt routines occur in conjunction with the operation of the main program routine of digital signal processor (DSP1) 52.

Turning to FIG. 4C, the commencement of the main program loop is represented. In the figure, node C again is reproduced which is seen leading to a command to reset thee interval interrupt flag as represented at block 366. Accordingly, the program will be capable of responding when the precise sampling interval interrupt occurs. Next, as represented at block 368, a determination is made as to what element or phase is at hand, i.e. A, C, or B. Recall that during a given interval, the voltage sample, then a current sample, then a second voltage sample, then a second current sample, are taken, whereupon the system moves at the presence of the next timing cycle to the next phase in rotation. Thus, in a single cycle, the meter 10 will have looked at three phases as opposed to considering a single cycle of a given phase and then a next cycle of a next succeeding phase. Accordingly, should a significant change occur on any phase or element within an interval greater than that amounting to $7\frac{1}{2}°$, it will be considered by the system and accuracy is enhanced where full waveforms or waveforms which are broken by switching systems and the like are encountered. Block 370 next shows that the voltage and current data from the next previous interval interrupt is stored. In effect, the data for one sample interval is treated in a next succeeding sample interval within a time pattern, the final output of the system at channel grouping 78 representing a timed and accurate sequence of sampling interval delays. Next, as represented initially at block 372, the program commences to evaluate the size of the current and voltage samples which have been taken. Industry recognizes a phenomenon referred to as "creep" which is considered to be a sampled signal which, in effect, is noise as opposed to a power or parameter quantity. In effect, samples will be too small to represent useful data. Accordingly, as represented at block 374, a determination is made as to whether the present sample is too small. In the event that it is, then as represented at line 376 and block 378, the memory pointers are incremented and as represented at block 380, zero values are placed for all quantities for this small sample of voltage. However, should the other electrical parameter, i.e. current be of adequate capacity and size, then as represented at block 382, the amplitude quantities representing that valuation are outputted. For example, the current valuation, notwithstanding the absence of voltage evaluations, may be utilized to derive amperes and ampere$^2$ quantity values. Correspondingly, if the current values are too small but the voltage values are acceptable, as represented at block 384, the voltage quantities are outputted. These quantities may be utilized, for example, for such quantities as volthours and volt$^2$. The program then continues as represented at node F.

The above evaluation for smallness of sample is carried out with respect to an entire cycle inasmuch as certain samples in any given cycle will be of small value. Thus, where the entire cycle evidences unacceptably small values, then that cycle is zeroed with respect to the electrical parameters under consideration.

In the event that the determination at block 374 indicates that useful information is present, then as represented by line 386 and block 388, for each sampling interval, the voltage data are multiplied by a full scale correction factor and stored in two locations, one being the instant compilation of increment values and the other being in an all phase or element, i.e. A, C, B register which combines the outputs of all phases or elements together. The program then continues as represented at block 390 to carry out a squaring of the voltage data and multiplication of the data by the volt$^2$ full scale correction factor. This value then is stored in the present and the earlier-noted all phase or element volt$^2$hour registers. The program then continues as represented at line 392 and block 394 to carry out a similar operation for each sampled increment with respect to current. In this regard, the current data are multiplied by the ampere full scale correction factor and the values are stored in the present and all phase or element amperehour registers. Next, as represented at block 396, the program squares the current data and multiplies it by an ampere$^2$ full scale correction factor. As before, these data are stored in the present and all phase or element ampere$^2$ registers. The program then continues as represented at line 398 and node E.

Figure 4D:
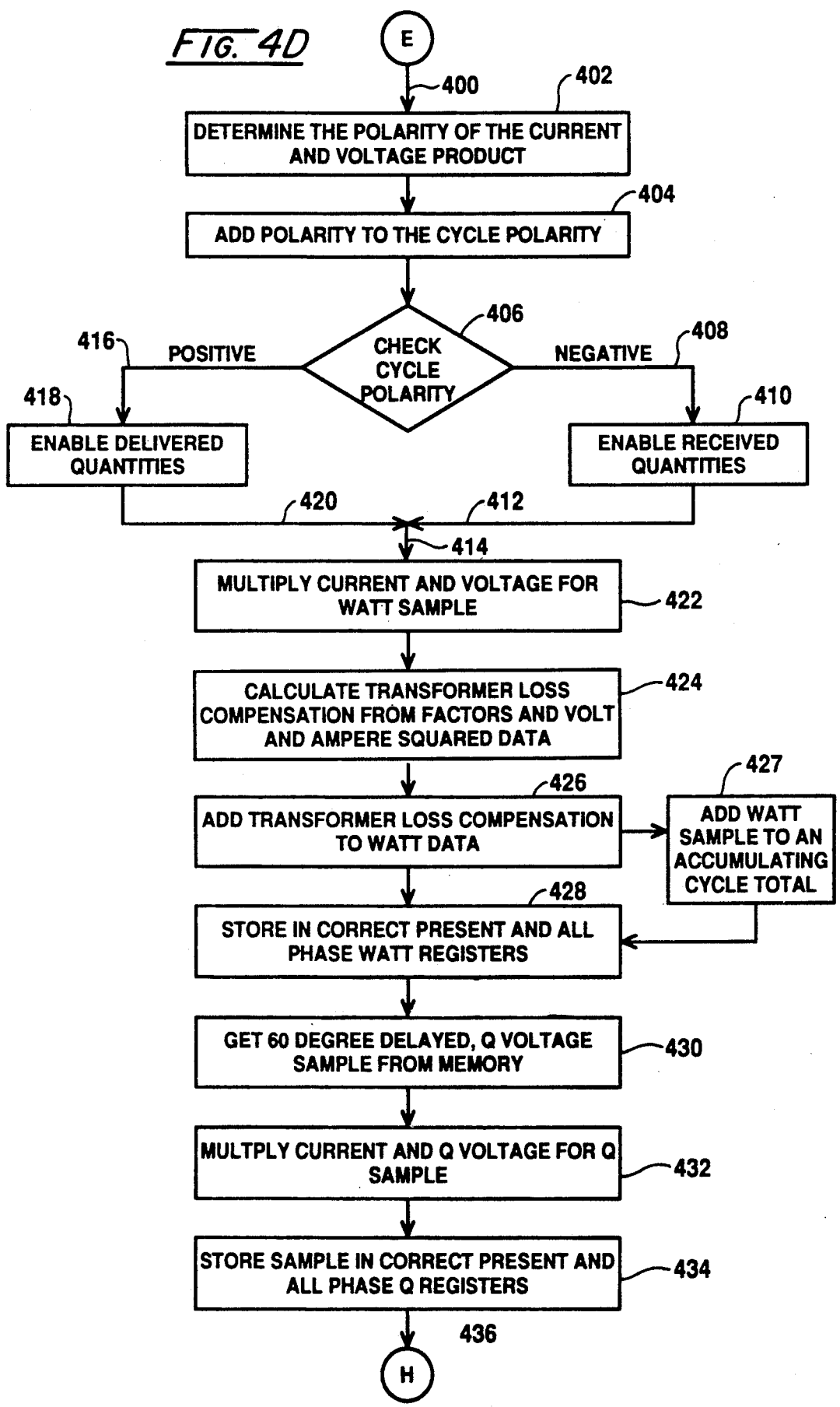

Looking to FIG. 4D, node E is seen to continue as represented at line 400 and block 402 where a determination of the polarity of the resultant watt sample or product of the current and voltage samples is carried out. Progressing to block 404, the program then adds the sample increment polarity to the accumulating cycle polarity and, as represented at block 406, a determination is made as to the resultant polarity. Thus, a determination is made as to whether power quantities are being delivered or received by the measured system. In general, if a whole cycle is positive a delivered quantity is present and if a full cycle is negative a received quantity is present. Note in this regard a negative determination is represented at line 408 leading to block 410 wherein an enablement of received quantities is provided, the program then continuing as represented at lines 412 and 414. On the other hand, where cycle polarity is positive, then as represented at line 416 and block 418, an enablement is made of the delivered quantities data flow and the program continues as represented at lines 420 and 414 to the instructions at block 422. Thus, for the particularly enabled received or delivered quantities, current and voltage are multiplied for a watt sample and, as represented at block 424, transformer loss compensation is calculated from retained factors and the volt$^2$ and ampere$^2$ data generated earlier as described in conjunction with blocks 388, 390, 394, and 396. Following this calculation, as represented at block 424, the transformer loss compensation is added to watt data and as represented at block 426. Next, as shown at block 427, the watt sample is added to an accumulating cycle total. The calculated watt data are stored in the correct present as well as all phase or element watt registers. For a development of Qhour quantity for the increment under consideration, as represented at block 430, a 60° delayed voltage sample is retrieved from memory under the carefully timed criteria of sample increments and, as represented at block 432 the current and that Q voltage sample are multiplied together to develop a Q sample for the instant increment. That sample is then stored in the correct present as well as in the all phase or element Q registers as represented at block 434 and the program continues as represented at line 436 and node H.

Figure 4E:
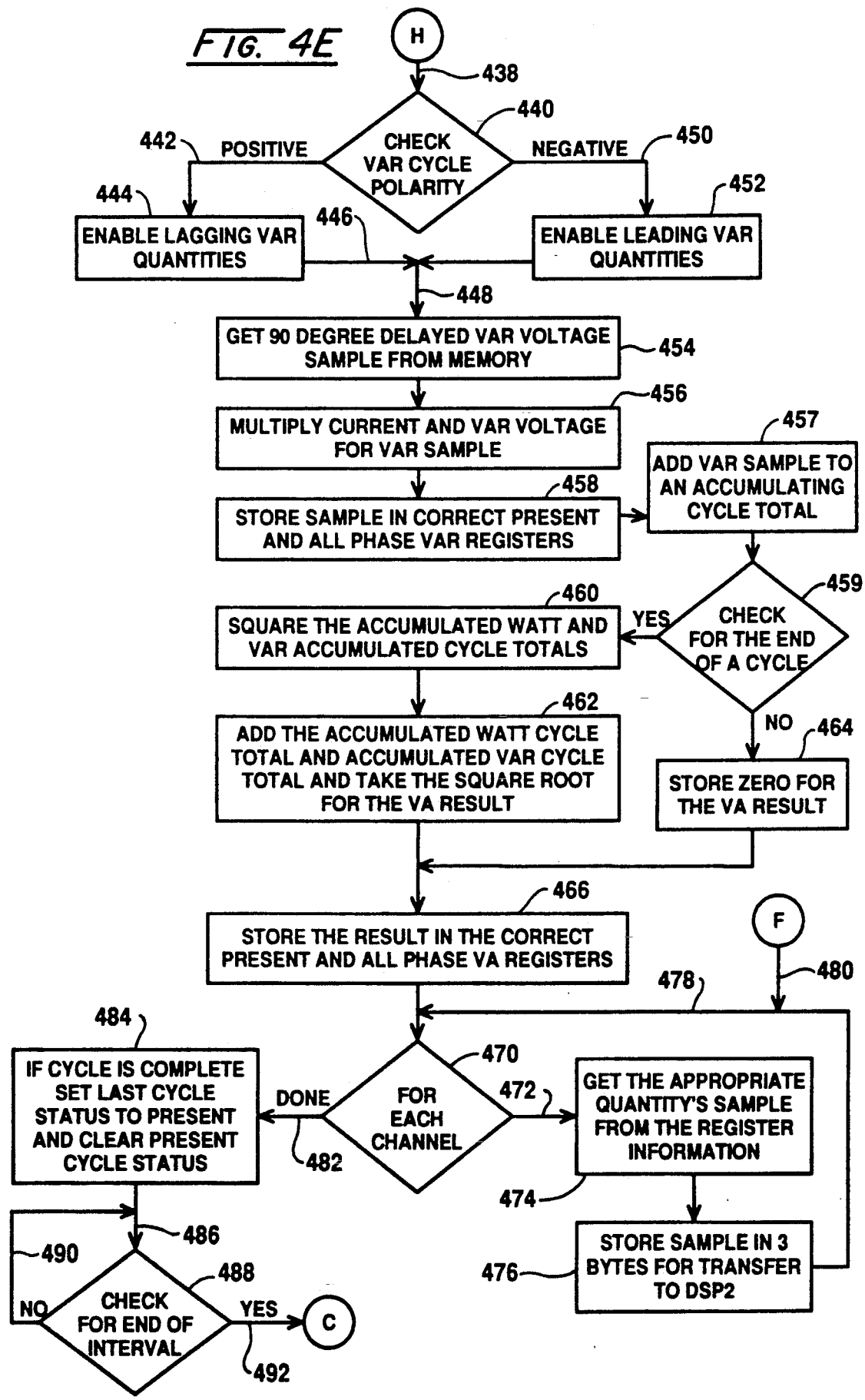

Referring to FIG. 4E, node H is seen to reappear in conjunction with line 438 leading to the inquiry at block 440. At block 440, a determination is made as to the VAR cycle polarity, inasmuch as this quantity may be presented as VARS in and out as well as VARS lead and lag. Where the VAR quantity is positive for this particular cycle, then, as represented by line 442 and block 444 an enablement is made of the lagging VAR quantities data flow and the program continues as represented at lines 446 and 448. On the other hand, should the check at block 440 show a negative valuation, then as represented at line 450, and at block 452, an enablement of leading VAR quantities data flow is carried out and the program continues as represented at lines 446 and 448. The program then proceeds to the instructions of block 454 wherein the 90° delay VAR voltage sample is obtained from memory, again employing the accurate timed interrupt sample interval feature. Sampled current and VAR voltage values are then multiplied for a VAR sample as represented in block 456 and, as represented at block 458, the VAR sample is stored in the correct present and all phase or element VAR registers. As shown at block 457, the VAR sample is added to an accumulating cycle total, whereupon an end of cycle check is made as represented at block 459. Block 460 shows that for an end of cycle, the watt and VAR samples are squared for the purpose set forth in block 462 wherein the square root of the squared watt and VAR data are obtained to develop a computed VA value. Block 464 shows that where an end of cycle is not present, zero is stored for the VA result and the activity represented at block 462 is bypassed. The instructions at block 466 provide for the storing of the VA result in the correct present and all phase or element VA registers. The program then proceeds, as represented at line 468 and block 470 for each of the six channels as represented in FIG. 1 at 78 elected by the meter user, and appropriate quantity samples are obtained from the registers as represented at line 472 and block 474. This information for each such channel is stored as represented at block 476 for transfer to digital signal processor (DSP2) 76. The program then loops as represented at line 478 to line 468. Note, additionally, line 480 extending from node F which has been discussed in connection with block 374 and line 376 in FIG. 4C with respect to determining whether the voltage or current information is too small for appropriate measurement. Also, as represented at line 482 and block 484, a determination is made as to whether a cycle is complete. If so, the last cycle status is set to present cycle status and the present cycle status is cleared. The program then proceeds as represented at line 486 and block 488 wherein a check is made for the end of a sampling interval. If the end of such a precise measurement interval is not present, then as represented at line 490 extending to line 486, the program loops and awaits the timing signal. Where the end of interval occurs, then as represented at line 492 and node C, the main program loop reiterates with entry at block 366 as represented above in FIG. 4C.

Figure 6:
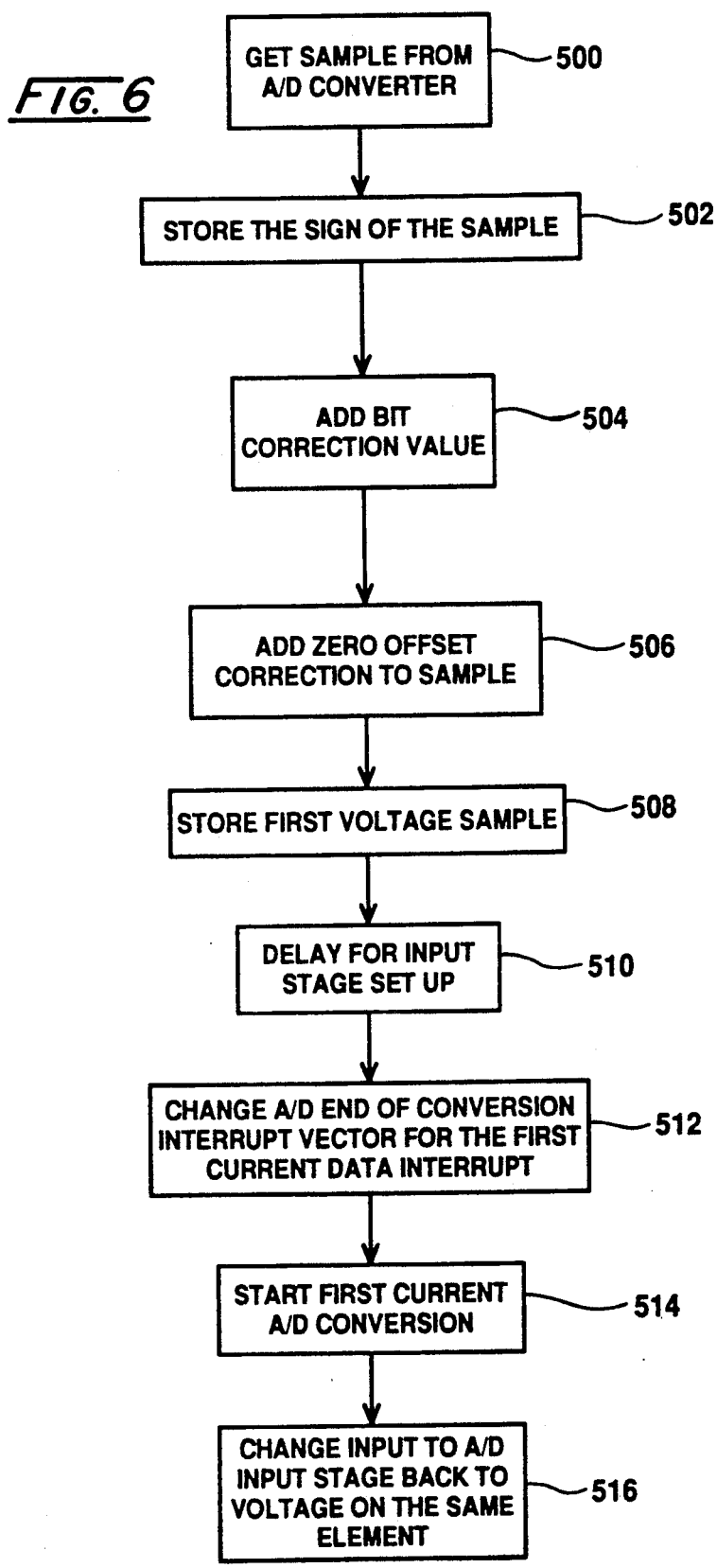
FIG. 6 is a flow chart for a first voltage data interrupt program.

As the main routine carries out its looping form of operation, interrupts are developed under the accurate timing of clock controller 62. For each such interrupt, i.e. for four different conversions including two voltage conversions and two current conversions carried out by converter 46, there exists an interrupt program. Looking to FIG. 6, the first voltage data interrupt program is revealed. This program is seen to commence with the instructions at block 500 wherein the sample of first voltage is obtained from converter 46. Then, as represented at block 504, a bit correction value is added to accommodate for the earlier-described truncation form of performance which is conventional with converters as at 46. Correction value selection is somewhat heuristic in nature, for example, the addition of one least significant bit being considered to be an enhancement of accuracy. The voltage interrupt program then continues as represented at block 506 wherein the zero offset correction is added to the first voltage sample and as represented at block 510, a delay is imposed for input stage set-up. In this regard, within each sample interval, it is desirable that the converter 46 generate a binary value in equally timed increments, for example four equal increments within the s/D). Thus, any required delay is provided which functions additionally to equalize the amount of time for the converter 46 to settle out for each conversion. The A/D converter interrupt vector is then changed for the next interrupt routine which will be a current data interrupt routine. The first current A/D conversion then is commenced as represented at block 514 and, as represented at block 516, the input to the A/D converter 46 is changed or realigned to carry out the second voltage measurement for the same element or phase being measured.

Referring to FIG. 7, the first current data interrupt which, again, as noted above, occurs in conjunction with an interrupt within the sampling interval representing 2½° of a cycle. The first current data interrupt program commences as represented at block 520 wherein the current sample is obtained from A/D converter 46 and, as represented at block 522, the sign of the sample is stored. A bit correction value is then added in the manner described in connection with block 504 in FIG. 6 as is represented in the instant figure at block 524 to provide for correction to the digitized signal and, as before, a zero offset correction is added to the sample as represented at block 526. The first current sample then is stored as represented at block 528 and a delay for input stage setup is carried out as represented at block 530. This delay, as described in connection with block 510 at FIG. 6 permits an equalization of the settling out period for A/D converter function 46 for each conversion action to assure equal accuracy for each such conversion. As represented at block 532, the end of conversion interrupt vector provided by the A/D converter function 46 is then changed in readiness for the second voltage data interrupt and as represented at block 534, the second voltage A/D conversion is started. To realign the system for the final current sampling, as represented at block 536, the input to the input stage of A/D converter 46 is changed to current for the same element or phase in anticipation of that final activity within the 2½° sampling interval.

Referring to FIGS. 8A and 8B, the second voltage data interrupt for a given sampling interval of 2½° is illustrated in diagrammatic fashion commencing with block 540 providing for the obtaining of a voltage sample from A/D converter function 46. The program then stores the sign of that sample as represented at block 542 and as provided at block 544, a bit correction value for improving the accuracy of conversion is added. Block 546, as before, describes the addition of a zero offset correction to the sample and as represented at block 548, the first and second voltage samples for this sampling interval then are averaged. Note additionally that the signs of these measurements also are accounted for in this averaging. Here again, the accuracy of this measurement of a voltage component is improved at this stage through this averaging function. Block 550 provides for loading the present element or phase voltage magnitude correction factor and as represented at block 552, the averaged voltage sample is multiplied by that factor. The voltage data is multiplied by a scaling factor as represented at block 554 and the sign value from the time based equivalent of a 90° earlier sample is recovered from memory as represented at block 556 for VAR sign purposes and the sign of the instant voltage value is stored essentially at that location in memory for providing the sign value of the next VAR quantity development. In this regard, note that the sign memory pointers are updated as represented at block 560. The data value from a 90° previous time in voltage valuation is obtained for VAR voltage computation as represented at block 562. The program then continues as represented at node G which is seen to continue at FIG. 8B with block 564 wherein the present voltage data value is stored for later VAR and Q use at appropriate locations in memory which, as before, are time based with respect to 90° and 60° positions. Block 566 provides for the updating the data memory pointers for such quantity development and as represented at block 568, the end of the conversion interrupt vector for converter function 46 is changed for the second current data interrupt of the instant sample interval. Bloc, 570 shows that the second current conversion on the part of A/D converter 46 is commenced and as represented at block 572, the element or phase pointer and compensation pointers are changed to the next element or phase in anticipation of the next succeeding sampling interval. Finally, as represented at block 574, the intput of the A/D converter 46 input stage is changed to voltage on this next succeeding element or phase.

Turning to FIG. 9, the second current data interrupt routine is portrayed, this interrupt essentially representing the final quarter of a 2½° sampling interval. The routine commences with the instructions at block 580 providing for the obtention of a sample from A/D converter function 46, whereupon, as represented at block 582, the sign of that sample is stored. As set forth in block 584, a bit correction value is added for truncation correction to the sample to enhance the accuracy of the output of A/D converter function 46 and, as represented at block 586, a zero offset correction is added to the sample. Next, as represented at block 588, the average of the first and second current samples, as well as their signs are averaged. Here again, the accuracy of the overall system is improved through the improvement of sample values at this stage of power evaluation. Block 590 provides for the loading of the present watt and current magnitude correction factors for the instant element or phase and, as represented at block 594, the averaged current sample is multiplied by the current factor to be used for ampere and ampere$^2$ calculations. Block 596 provides for the multiplication of the current data by a scaling factor and, as represented at block 598, the current element or phase pointer is changed to the next phase or element.

Figure 10:
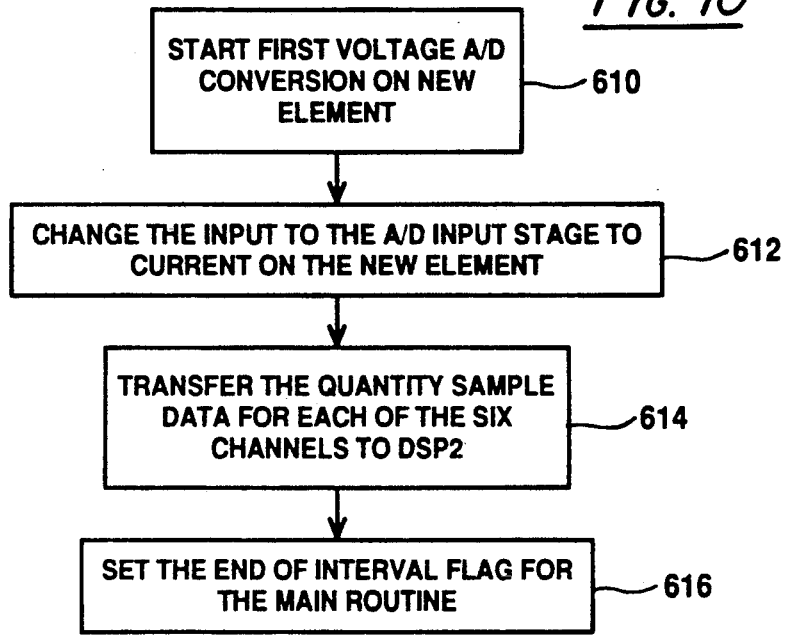
FIG. 10 is a flow chart for an interval interrupt program.

Looking to FIG. 10, an interval interrupt routine is revealed which occurs following the next preceding sampling interval representing 2½°. In effect, the interval interrupt routine is somewhat similar to the initialization procedures. The routine is seen to commence at block 610 wherein the first voltage conversion by A/D converter function 46 is carried out with the next or new element or phase. As represented at block 612, the input to the A/D converter function 46 input stage is altered to point to current on this next element or phase and, as represented at block 614, the quantity sample data for each of the six channels elected by the user are transferred to digital signal processor (DSP2) 76. Note, therefore, that this transfer to that processor takes place in a next succeeding sampling interval. Finally, as represented at block 616, the end of interval flag for the main routine is set. It may be recalled that the transfer as represented at block 614 occurs in three byte format.

Figure 11:
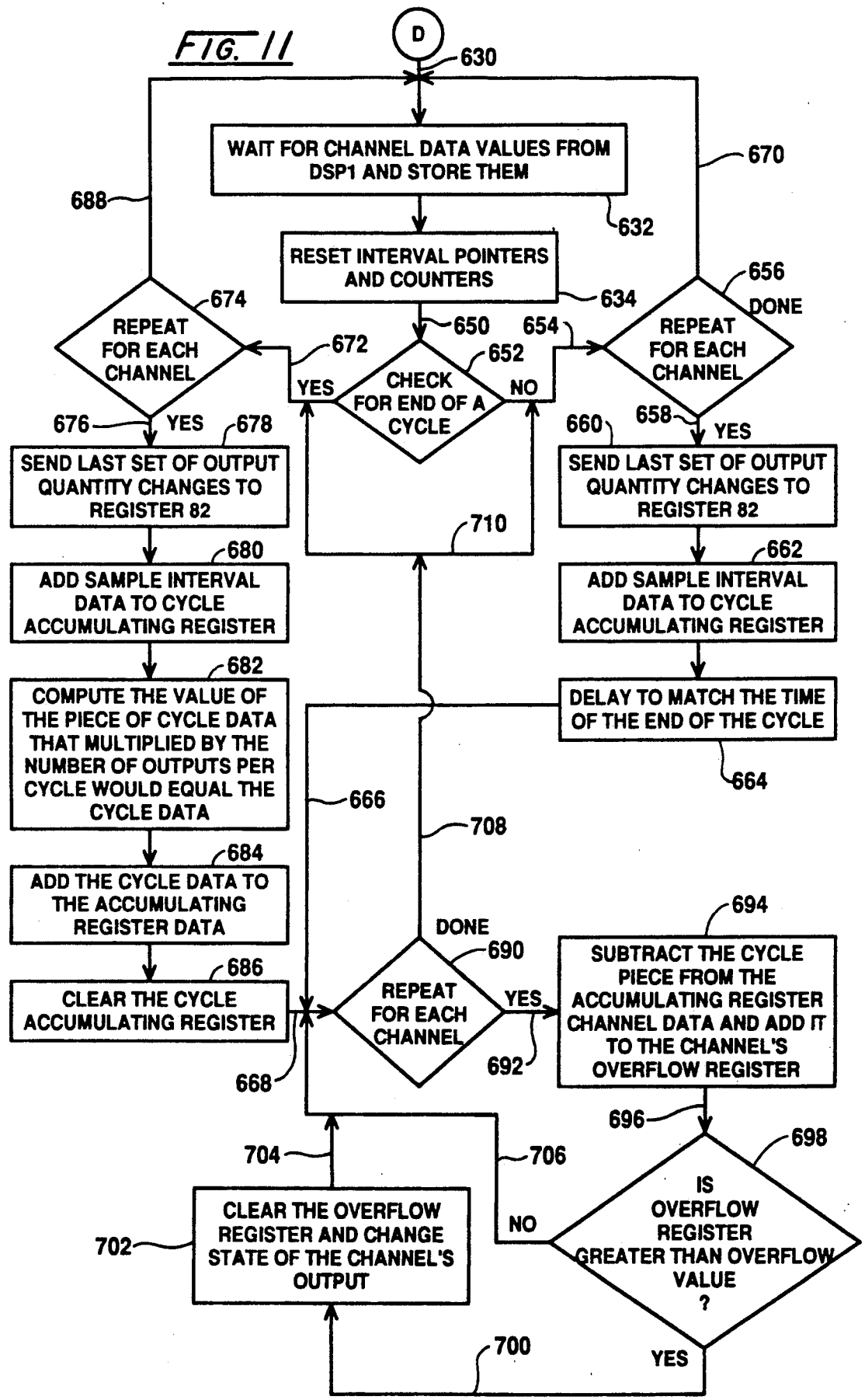
FIG. 11 is a flow chart for an increased time accuracy output program.

Following the initialization routine for digital signal processor (DSP2) 76 as described in conjunction with FIGS. 5A and 5B, the processor dwells awaiting the transfer of a sampling interval of data to it as described in conjunction with block 614 of FIG. 10. It may be recalled that the initialization of this processing function terminated at a node D shown in FIG. 5B. Referring to FIG. 11, this node D is reproduced in conjunction with line 630 which commences an increased time accuracy output routine. Line 630 leads to block 632 which indicates that this computer fuction is awaiting channel data values from digital signal processor (DSP1) 52. When these values arrive, they are stored, and as represented at block 634, the interval pointers and counters are reset. This increased time accuracy output routine of FIG. 11 is controlled and synchronized with respect to the sampling interval representing 2½° as developed from clock controller function 62. Thus, while the ultimate output of the system at the six channel output 78 is delayed, such delay is in time synchronism with the overall timing of the apparatus 10 to preserve accuracy. To facilitate the discourse to follow, reference additionally is made to FIG. 12 wherein a data flow diagram representing the interrelationship of three registers within processor 76 is set forth. In the figure, a cycle accumulating register is represented at block 636 which will be seen to function to accumulate sampling interval data until an entire cycle of data is compiled. Thus, for a 2½° sampling interval, 144 sampling intervals of data are compiled. These data then are transferred as an entire cycle value as represented at line 638 to an accumulating register represented at block 640. From this accumulating register 640, as represented by line 642, small components or pieces of the assembled quantity value are transferred in minute increments to an overflow register as represented at block 644. For example, seven of these subintervals may be employed for each sampling interval of 2½°. Thus, for a cycle's worth of data representing a measured quantity, the value of the full cycle's worth of that quantity is divided by 144 intervals representing a cycle of data multiplied by seven subintervals and the product thereof is divided into the value of the entire cycle data. These small increments then are transferred to the overflow register 644 such as the quantities in the overflow register approach its designated overflow value, that value will be reached within an enhanced timed accuracy. It may be recalled that the output for the six channels as represented in FIG. 1 at 78 is one of pulses, each representing the predetermined quantity unit elected by the user of the meter. Thus, it may be seen that the pulse output of the overflow register is directed as a datum represented at line 646 to the channel data function herein represented at 78'.

Returning to FIG. 11, data are submitted in timed correspondence with a sampling interval, and as represented by line 650 and block 652, a determination is made as to whether an end of the cycle has been reached. In the event that it has not, then as represented at line 654, the routine carries out a series of operations for each of the six channels of information or data which are developed as represented at line grouping 78. This repetition for each channel is represented at block 656 and, for each such channel during this process and before all six channels are completed, as represented at line 658 and block 660, if data collection and the like has been completed to an extent where transfer to register 82 (FIG. 1) as represented at line grouping 78 is appropriate, then that transfer takes place in timed synchronism. Additionally, as provided at block 662, the sample interval data representing 2½° of information are added to the cycle accumulating register as discussed at block 636 in FIG. 12. Eventually, the entire cycle's worth of such data are then transferred and this transfer is coordinated to provide for the transmission of a cycle's worth of data within the synchronizing subinterval timing system. Thus, a delay for this synchronization is provided as represented at block 664. A full cycle's accumulation of data then are transferred in this synchronous manner as represented at line 666 leading to line 668. Returning to block 656, where each channel has been so treated, then as represented at line 670, the routine returns to line 630. The end of the cycle also is represented by line 672 extending from block 652 to block 674. The latter block indicates that the procedure is to be carried out for each channel of data and the procedure to follow is one for the purpose of computing subinterval data described at line 642 in FIG. 12. Accordingly, as represented at line 676 and block 678, the last set of output quantity changes are sent to the register 82, a procedure corresponding and the same as that described in connection with block 660. Where such data are ready, then it is sent. The routine additionally, as represented at block 680, adds the interval data to the cycle data within the cycle accumulating register described in conjunction with block 636 in FIG. 12 and here shown at block 680. As before, this is the same function as described at block 662. However, this portion of the routine then seeks to develop the subinterval data through the procedure represented at block 682 and discussed in connection with line 642 in FIG. 12. In this regard, the value of the piece of cycle data that, multiplied by the number of outputs per cycle, is derived where that value would equal the value of the entire cycle data. In effect, as noted above, this represents the product of the subinterval times the numer of sampling intervals per cycle divided into the value of a cycle's worth of data. The routine then continues as represented at block 684 to add the cycle data to the accumulating register data as described in conjunction with line 638 and block 640 in FIG. 12. Then, as represented at block 686, the cycle accumulating register as well as counters are cleared and the routine continues to the earlier-described line 668. Returning to block 674, where each channel, for example six channels, are so treated, then as represented at line 688 the routine repeats as represented by the extension of the latter line to line 630.

Figure 12:
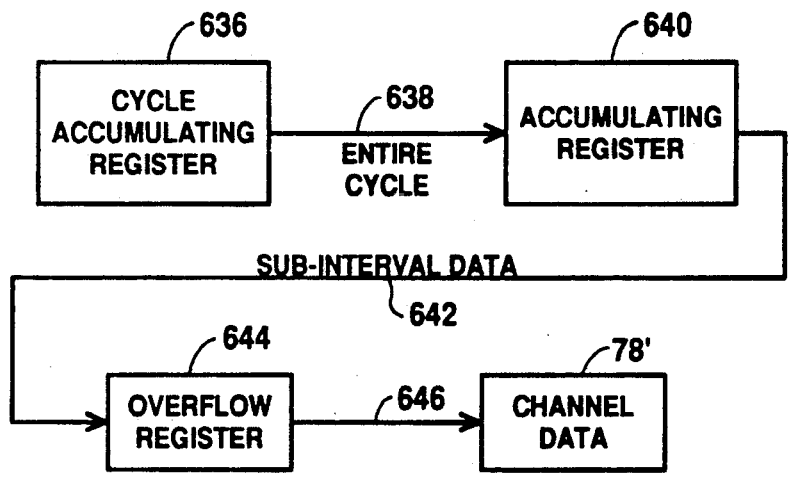
FIG. 12 is a data flow block diagrammatic representation of certain features of the control portion of the invention.

Line 668 is seen to lead to block 690, again representing that a repetition for each of the channel outputs is provided. For each channel, as represented at line 692 and block 694, then the subinterval data here described as a cycle piece from the accumulating register as represented at block 640 is added to that channel's overflow register as represented in FIG. 12 by line 642 and block 644. The program then continues as represented at line 696 and decision block 698 where a determination is made as to whether the overflow register value is greater than its predetermined overflow value. The latter overflow value is selected by the user in accordance with given operational needs. Where the subinterval data added does indeed now exceed this threshold overflow value, which, because of the subinterval treatment thereof typically will be only a small excess, then, as represented at line 700 and block 702, the overflow register is cleared and the state of that channel's output is changed and represents an incremental increase in output at that selected channel of those represented in channel grouping 78 in FIG. 1. Upon such clearance of the overflow register, then as represented at line 704, this portion of the routine continues as represented at line 668. When the overflow register value is not greater than its overflow value as represented by the determination at block 698, then as represented at line 706, the same procedure occurs, the repetition for each channel continuing with the addition of subinterval data to the overflow register. Where each channel is so treated as represented at block 690 and lines 708 and 710, the program returns to carry out the procedures as represented by the flow of logic described from lines 654 and 672.

Since certain changes may be made in the above apparatus and method without departing from the scope of the invention herein involved, it is intended that all matter contained in the above description or shown in the accompanying drawings shall be interpreted as illustrative and not in a limiting sense.

We claim:

1. Apparatus for metering a power supply, comprising:
   scaling means connectable with said supply for deriving scaled current and voltage signals of given amplitude;
   selector means actuable for selecting said scaled current and voltage signals;
   converter means actuable to sample the amplitudes of said scaled current and voltage signals within predetermined regular sampling intervals for effecting the conversion thereof to corresponding uncorrected current and voltage digital values; and
   control means for actuating said selector means and said converter means, for providing predetermined intra-integer bit correction to said uncorrected current and voltage digital values to provide corrected current and voltage digital sample signals for each said sampling interval, for effecting select arithmetic treatment of said corrected current and voltage digital sample signals to derive digital power quantity signals, and for selectively accumulating said digital power quantity signals to derive pulse categorized meter output signals.

2. The method for metering an electrical power supply having first and second parameters exhibiting given relative cycle phase relationship, comprising the steps of:
   scaling said first and second parameters to derive corresponding first and second electrical parameter signals;
   sampling said first and second electrical parameter signals within predetermined regular sampling intervals to provide corresponding first and second digital parameter signals;
   treating said first and second digital parameter signals to provide predetermined electrical quantity signals of given values;
   accumulating said predetermined electrical quantity signals for a predetermined interval to provide an accumulated value for said electrical quantity signals;
   determining a subinterval value representing a portion of said accumulated value corresponding with a predetermined increment of a said sampling interval;
   providing an overflow accumulator having a predetermined overflow value;
   transferring said subinterval value to said overflow accumulator until said overflow value is reached; and
   outputting a quantity pulse when said overflow value is reached.

3. The method of claim 2 in which said predetermined interval of said accumulation of electrical quantity signals corresponds with the interval of one cycle of a said electrical power supply.

4. The method of claim 3 in which said sampling interval is a fraction of said one cycle of said electrical power supply.

5. Apparatus for metering a power supply having current and voltage parameters exhibiting given relative cycle phase relationship, comprising:
   a sampling network actuable within predetermined regular sampling intervals to provide current and voltage digital signals corresponding with said current and voltage parameters; and
   control means including first accumulator means and an overflow accumulator means having a predetermined overflow value for selectively actuating said sampling network to derive said current and voltage digital signals, for treating said current and voltage digital signals to provide predetermined electrical quantity signals of given values, for accumulating said predetermined electrical quantity signals at said first accumulator means for a predetermined interval to provide an accumulated value for said electrical quantity signals, for deriving a subinterval value representing a portion of said accumulated value corresponding with a predetermined increment of a said sampling interval, for transferring said subinterval value to said overflow accumulator means at a rate corresponding with said increment of a said sampling interval until said overflow value is reached, and for outputting a quantity pulse when said overflow value is reached.

6. The apparatus of claim 5 in which said control means is responsive to actuate said sampling means at least twice during said sampling interval to provide at least two preliminary said current and voltage digital signals and is responsive to average said preliminary current and voltage digital signals for providing said predetermined electrical quantity signals.

7. The apparatus of claim 5 in which said predetermined interval of said accumulation of electrical quantity signals corresponds with the interval of one cycle of said current and voltage parameters.

8. The apparatus of claim 5 including:
   scaling means connectable to said power supply for deriving scaled current and voltage signals for corresponding cycles of said supply and having a post scaling relative cycle phase relationshp;
   a cycle phase shift network responsive to one of said scaled current and voltage signals and controllable for aligning said post scaling relative cycle phase relationship to a correspondence with said given relative cycle phase relationship to provide cycle phase corrected said current and voltage digital signals; and
   said control means effects control of said cycle phase shift network.

9. The apparatus of claim 5 in which:
   said sampling network includes an analog-to-digital converter actuable by said control means within said sampling interval to provide preliminary current and voltage digital signals; and
   said control means is responsive to said preliminary current and voltage digital sample signals to apply a binary digital truncation correction thereto.

10. Apparatus for monitoring an electrical power supply having first and second electrical parameters exhibiting given relative cycle phase relationship comprising:
   scaling means connectable with said supply for deriving first and second electrical parameter signals for corresponding cycles of said supply having a post scaling relative cycle phase relationship;
   a cycle phase shift network including a phase delay network coupled to receive a select said electrical parameter signal for effecting a phase delay thereof in correspondence with the select impedance of a variable impedance component provided as a digital-to-analog converter controllable in response to a digital input for aligning said post scaling relative cycle phase relationship to a correspondence with said given relative cycle phase relationship to provide first and second cycle phase corrected electrical parameter signals;

a sampling network actuable for sampling the amplitudes of said first and second phase corrected electrical parameter signals and deriving corresponding first and said digital sample signals; and control means for controlling said cycle phase shift network by providing said digital input, for actuating said sampling network within predetermined regular sampling intervals to derive said first and second digital sample signals for effecting select arithmetic treatment of said first and second digital sample signals to derive digital power quantity signals, and for selectively accumulating said digital power quantity signals to derive pulse categorized meter output signals.

11. The apparatus of claim 10 in which said control means is responsive to arithmetically treat said first and second digital sample signals to derive said digital power quantity signals as watt$^2$ signals and VAR$^2$ signals, and is responsive to said watt$^2$ and VAR$^2$ signals to derive volt ampere signals as the square root of the sum thereof.

12. The apparatus of claim 10 in which said control means includes clock means for providing clock signals and is responsive to said clock signals for deriving said sampling intervals and is responsive to a succession of said sampling intervals representing 60° of a said cycle to derive digital power quantity signals as Q signals.

13. The apparatus of claim 10 in which said control means includes clock means for providing clock signals and is responsive to said clock signals for deriving said sampling intervals and is responsive to a succession of said sampling intervals representing 90° of a said cycle to derive said digital power quantity signals as VAR signals.

14. Apparatus for monitoring an electrical power supply having first and second electrical parameters exhibiting given relative cycle phase relationship comprising:

scaling means connectable with said supply for deriving first and second electrical parameter signals for corresponding cycles of said supply having a post scaling relative cycle phase relationship;

a cycle phase shift network responsive to a select said electrical parameter signal and controllable for aligning said post scaling relative cycle phase relationship to a correspondence with said given relative cycle phase relationship to provide first and second cycle phase corrected electrical parameter signals;

a sampling network including an analog-to-digital converter actuable for sampling the amplitudes of said first and second phase corrected electrical parameter signals to provide corresponding preliminary first and second digital sample signals; and control means for controlling said cycle phase shift network, for actuating said sampling network within predetermined regular sampling intervals to derive said preliminary first and second digital sample signals, responsive to said preliminary first and second digital parameter signals to apply a binary digital truncation correction to said preliminary first and second digital parameter signals to derive corresponding first and second digital sample signals, for effecting select arithmetic treatment of said first and second digital sample signals to derive digital power quantity signals, and for selectively accumulating said digital power quantity signals to derive pulse categorized meter output signals.

15. The apparatus of claim 14 in which said control means is responsive to actuate said analog-to-digital converter at least four times within said sampling interval to provide at least two of each said preliminary first and second digital parameter signals, is responsive to apply said truncation correction to each said preliminary first and second digital parameter signals and is responsive thereto to carry out an averaging thereof prior to effecting said select arithmetic treatment.

16. Apparatus for metering a polyphase power supply with first to last elements, comprising:

scaling means connectable with said power supply for deriving scaled current and voltage signals corresponding with each said element;

a sampling network including an analog-to-digital converter actuable for sampling the amplitude of said scaled current and voltage signals to provide corresponding preliminary current and voltage digital sample signals; and control means for actuating said sampling network within predetermined sampling intervals to derive at least two said preliminary voltage digital sample signals and at least two said preliminary current digital sample signals within said sampling interval, responsive to said preliminary voltage and current digital sample signals to apply a binary digital truncation correction thereto to derive corresponding voltage digital sample signal and current digital sample signals, and for carrying out the averaging thereof to provide corresponding averaged voltage sample signals and averaged current sample signals, for effecting select arithmetic treatment of said averaged voltage sample signals to derive digital power quantity signals, and for selectively accumulating said digital power quantity signals to derive pulse categorized meter output signals.

17. The apparatus of claim 16 in which:

said control means effects actuation of said converter at equal, successive time increments within each said sampling interval.

18. The apparatus of claim 16 in which said sampling interval is selected to correspond with about 2$\frac{1}{4}$° of a 360° cycle of said power supply.

19. The apparatus of claim 16 including:

a cycle phase shift network responsive to said scaled voltage signals and controllable for aligning the cycle phase position thereof with respect to the cycle phase position of corresponding said scaled current signals to a relationship substantially matching that of said power supply; and said control means effects said control of said cycle phase shift network.

20. The apparatus of claim 16 in which said control means is responsive to arithmetically treat said averaged current and averaged voltage sample signals said digital power quantity signals as watt$^2$ signals and VAR$^2$ signals, and is responsive to said watt$^2$ signals and said VAR$^2$ signals to derive volt ampere signals as the square root of the sum thereof.

21. The method for metering an electrical power supply having firs and second parameters exhibiting given relative cycle phase relationship, comprising the steps of:

scaling said first and second parameters to derive corresponding first and second electrical parameters signals;

sampling said first and second electrical parameter signals with predetermined regular sampling intervals representing a fraction of one cycle of said power supply to provide corresponding first and second digital parameter signals;

treating said first and second digital parameter signals to provide predetermined electrical quantity signals of given values;

accumulating said predetermined electrical quantity signals for a predetermined interval corresponding with the interval of one cycle of said power supply, to provide an accumulated value for said electrical quantity signals;

determining a subinterval value representing a portion of said accumulated value corresponding with a predetermined increment of a said sampling interval, said subinterval value being determined as said accumulated value divided by the product of the number of said sampling intervals represented by said predetermined interval and a predetermined transfer factor;

providing an overflow accumulator having a predetermined overflow value;

transferring said subinterval value to said overflow accumulator until said overflow value is reached; and outputting a quantity pulse when said overflow value is reached.

22. The method for metering an electrical power supply having first and second parameters exhibiting given relative cycle phase relationship, comprising the steps of:

scaling said first and second parameters to derive corresponding first and second electrical parameter signals;

sampling said first and second electrical parameter signals within predetermined regular sampling intervals, said sampling being carried out at least twice within each said sampling interval to provide corresponding first and second digital parameter signals, and said first and second digital parameter signals are an average of the value of said sampling;

treating said first and second digital parameter signals to provide predetermined electrical quantity signals of given values;

accumulating said predetermined electrical quantity signals for a predetermined interval to provide an accumulated value for said electrical quantity signals;

determining a subinterval value representing a portion of said accumulated value corresponding with a predetermined increment of a said sampling interval;

providing an overflow accumulator having a predetermined overflow value;

transferring said subinterval value to said overflow accumulator until said overflow value is reached; and outputting a quantity pulse when said overflow value is reached.

23. The method of claim 22 in which said sampling of said first and second parameter signals includes the steps of:

providing an analog-to-digital converter;

converting said first and second parameter signals to binary digital form with said analog-to-digital converter to provide preliminary first and second digital parameter signals;

applying a binary digital truncation correction to said preliminary first and second digital parameter signals to form said first and second digital parameter signals.

24. The method for metering an electrical power supply having first and second parameters exhibiting given relative cycle phase relationship, comprising the steps of:

scaling said first and second parameters to derive corresponding first and second electrical parameter signals;

sampling said first and second electrical parameter signals within predetermined regular sampling interval by:

providing an analog-to-digital converter, converting said first and second parameter signals to binary digital form with said analog-to-digital converter to provide preliminary first and second digital parameter signals, and applying a binary digital truncation correction to said preliminary first and second digital parameter signals to form corresponding first and second digital parameter signals;

treating said first and second digital parameter signals to provide predetermined electrical quantity signals of given values;

accumulating said predetermined electrical quantity signals for a predetermined interval to provide an accumulated value for said electrical quantity signals;

determining a subinterval value representing a portion of said accumulated value corresponding with a predetermined increment of a said sampling interval;

providing an overflow accumulator having a predetermined overflow value;

transferring said subinterval value to said overflow accumulator until said overflow value is reached; and outputting a quantity pulse when said overflow value is reached.

25. Apparatus for metering a power supply having current and voltage parameters exhibiting given relative cycle phase relationship comprising:

a sampling network actuable within predetermined regular sampling intervals to provide preliminary current and voltage digital signals corresponding with said current and voltage parameters; and control means including first accumulator means and an overflow accumulator means having a predetermined overflow value for selectively actuating said sampling network at least twice during said sampling interval to provide at least two said preliminary current and voltage digital signals, responsive to average said preliminary current and voltage signals to derive current and voltage digital signals, for treating said current and voltage digital signals to provide predetermined electrical quantity signals of given values, for accumulating said predetermined electrical quantity signals at said first accumulator means for a predetermined interval to provide an accumulated value for said electrical quantity signals, for deriving a subinterval value representing a portion of said accumulated value corresponding with a predetermined increment of a said sampling interval, for transferring said subinterval value to said overflow accumulator means at a rate corresponding with said increment of a said sampling interval until said overflow value is reached, and for outputting a quantity pulse when said overflow value is reached.

26. Apparatus for metering a power supply having current and voltage parameters exhibiting given relative cycle phase relationship, comprising:
   a sampling network including an analog-to-digital converter actuable within predetermined regular sampling intervals to provide preliminary current and voltage digital signals corresponding with said current and voltage parameters; and
   control means including first accumulator means and an overflow accumulator means having a predetermined overflow value for selectively actuating said sampling network to derive said preliminary current and voltage digital signals, responsive to said preliminary current and voltage digital sample signals to apply a binary digital truncation correction thereto to derive current and voltage digital signals, for treating said current and voltage digital signals to provide predetermined electrical quantity signals of given values, for accumulating said predetermined electrical quantity signals at said first accumulator means for a predetermined interval to provide an accumulated value for said electrical quantity signals, for deriving a subinterval value representing a portion of said accumulated value corresponding with a predetermined increment of a said sampling interval, for transferring said subinterval value to said overflow accumulator means at a rate corresponding with said increment of a said sampling interval until said overflow value is reached, and for outputting a quantity pulse when said overflow value is reached.

27. The method of claim 24 in said sampling of said first and second parameter signals is carried out at least twice within each sampling interval and said first and second digital parameter signals are an average of the values of said sampling.

* * * * *